(12) United States Patent
Toyokawa et al.

(10) Patent No.: US 9,349,463 B2
(45) Date of Patent: May 24, 2016

(54) SEMICONDUCTOR DEVICE AND METHOD OF MANUFACTURING THE SAME

(71) Applicant: Renesas Electronics Corporation, Kanagawa (JP)

(72) Inventors: Shigeya Toyokawa, Kanagawa (JP); Michimoto Kaminaga, Kanagawa (JP); Kentaro Yamada, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/679,056

(22) Filed: Apr. 6, 2015

(65) Prior Publication Data
US 2015/0311220 A1  Oct. 29, 2015

(30) Foreign Application Priority Data

Apr. 25, 2014  (JP) .................. 2014-092051

(51) Int. Cl.
| | |
|---|---|
| *H01L 27/108* | (2006.01) |
| *G11C 16/12* | (2006.01) |
| *H01L 27/115* | (2006.01) |
| *H01L 29/788* | (2006.01) |
| *H01L 21/3065* | (2006.01) |
| *H01L 21/308* | (2006.01) |
| *H01L 21/3105* | (2006.01) |
| *H01L 21/311* | (2006.01) |
| *H01L 21/02* | (2006.01) |
| *H01L 21/28* | (2006.01) |
| *G11C 16/14* | (2006.01) |
| *G11C 16/08* | (2006.01) |
| *G11C 16/26* | (2006.01) |

(52) U.S. Cl.
CPC ............. *G11C 16/12* (2013.01); *G11C 16/08* (2013.01); *G11C 16/14* (2013.01); *G11C 16/26* (2013.01); *H01L 21/02164* (2013.01); *H01L 21/02238* (2013.01); *H01L 21/28167* (2013.01); *H01L 21/28273* (2013.01); *H01L 21/3065* (2013.01); *H01L 21/3086* (2013.01); *H01L 21/31053* (2013.01); *H01L 21/31111* (2013.01); *H01L 27/11524* (2013.01); *H01L 27/11531* (2013.01); *H01L 27/11558* (2013.01); *H01L 29/7883* (2013.01); *H01L 21/02255* (2013.01)

(58) Field of Classification Search
CPC .............. G11C 16/12; H01L 27/11524; H01L 27/11558
USPC ........................................................ 257/296
See application file for complete search history.

(56) References Cited

U.S. PATENT DOCUMENTS 7,460,396 B2  12/2008  Oka et al.

FOREIGN PATENT DOCUMENTS

JP  2007-110073 A  4/2007

*Primary Examiner* — Anthony Ho
(74) *Attorney, Agent, or Firm* — Mattingly & Malur, PC

(57) ABSTRACT

To enhance the write speed of a nonvolatile memory. A charge injection/emission part of a nonvolatile memory cell includes an active region having an upper face, a side wall, and a shoulder part connecting the upper face and the side wall, a conductor film covering the upper face and the shoulder part of the active region, and a capacitance insulating film provided between the conductor film and the active region. Furthermore, the active region has a protrusion part constituted of a first concave part with respect to the upper face and a second concave part with respect to the side wall, in the shoulder part.

12 Claims, 14 Drawing Sheets

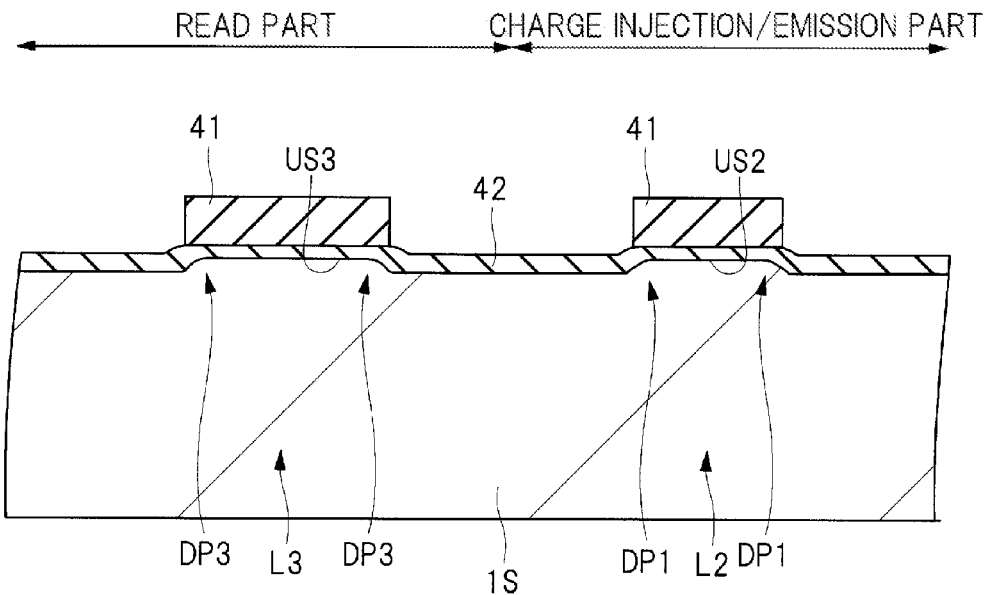
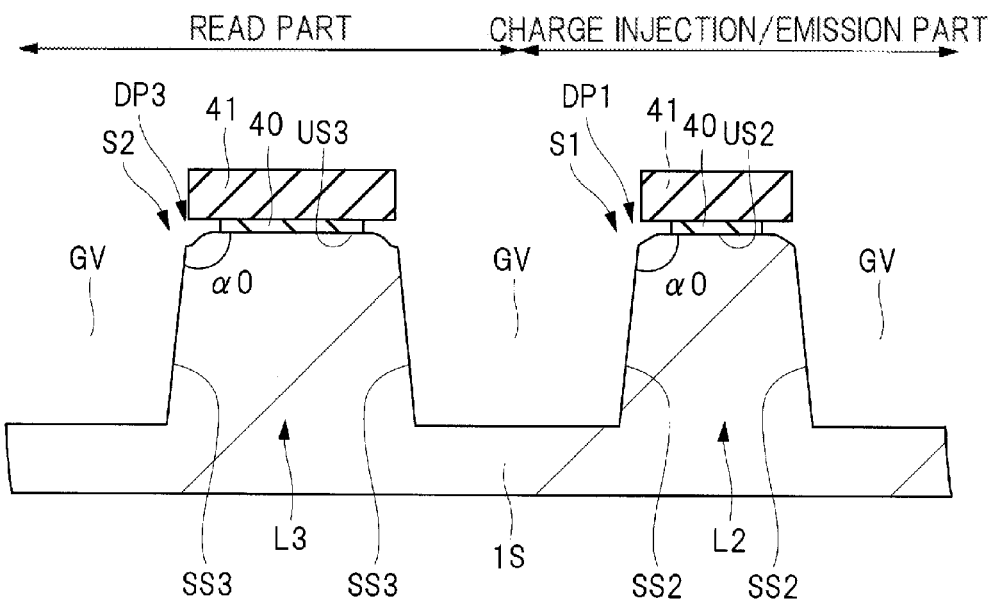

DP1:FIRST CONCAVE PART
DP2:SECOND CONCAVE PART
L2:ACTIVE REGION
PJ1:PROTRUSION PART
SS2:SIDE WALL
S1:SHOULDER PART
US2:UPPER FACE
10d:CAPACITANCE INSULATING FILM
20:CONDUCTOR FILM

SEMICONDUCTOR DEVICE AND METHOD OF MANUFACTURING THE SAME

CROSS-REFERENCE TO RELATED APPLICATION

The disclosure of Japanese Patent Application No. 2014-092051 filed on Apr. 25, 2014 including the specification, drawings and abstract is incorporated herein by reference in its entirety.

TECHNICAL FIELD

The present invention relates to a semiconductor device and a manufacturing method thereof, and relates to, for example, a technique which is effective when applied to a semiconductor device including a nonvolatile memory.

BACKGROUND

A semiconductor device sometimes includes a nonvolatile memory, within the semiconductor device, for storing information to be used in, for example, relief or in trimming such as image adjustment of an LCD (Liquid crystal Display) or information of a comparatively small capacity such as the manufacturing number of a semiconductor device. Furthermore, a nonvolatile memory constituted of a conductor film of polycrystalline silicon and the like is an example of such a nonvolatile memory.

Japanese Patent Laid-Open No. 2007-110073 (patent document 1) discloses such a nonvolatile memory constituted of a conductor film such as polycrystalline silicon. In the nonvolatile memory disclosed in patent literature 1, a floating gate electrode constituted of the conductor film such as polycrystalline silicon is formed over a major surface of a semiconductor substrate, via a gate insulating film. Furthermore, in the nonvolatile memory disclosed in patent literature 1, a capacitance part (element) for data write and erase, a transistor for data read, and a capacitance part are disposed at positions where this floating gate electrode overlaps each of a plurality of active regions formed on the major surface of the semiconductor device. Then, the capacitance part for the data write and erase performs data write and erase by using FN (Fowler-Nordheim) tunnel current across the whole channel plane.

SUMMARY

Problem to be Solved by the Invention

In the semiconductor device including the nonvolatile memory, write speed of the nonvolatile memory is required to be enhanced.

Other problems and the new feature will become clear from the description of the present specification and the accompanying drawings.

Solution for Solving the Problem

According to an embodiment, a write/erase element of a nonvolatile memory cell includes an active region having an upper face, a side wall, a shoulder part connecting the upper face and the side wall, a conductor film covering the upper face and the shoulder part of the active region, and a capacitance insulating film provided between the conductor film and the active region. Furthermore, the active region has a protrusion part constituted of a first concave part with respect to the upper face and a second concave part with respect to the side wall, in the shoulder part.

Effect of the Invention

According to the above embodiment, the write speed of the nonvolatile memory is enhanced.

BRIEF DESCRIPTION OF THE DRAWINGS

FIG. 12 is a principal part cross-sectional view subsequent to FIG. 11, during a manufacturing process of a semiconductor device;

FIG. 13 is a principal part cross-sectional view subsequent to FIG. 12, during a manufacturing process of a semiconductor device;

DETAILED DESCRIPTION

Figure 1:
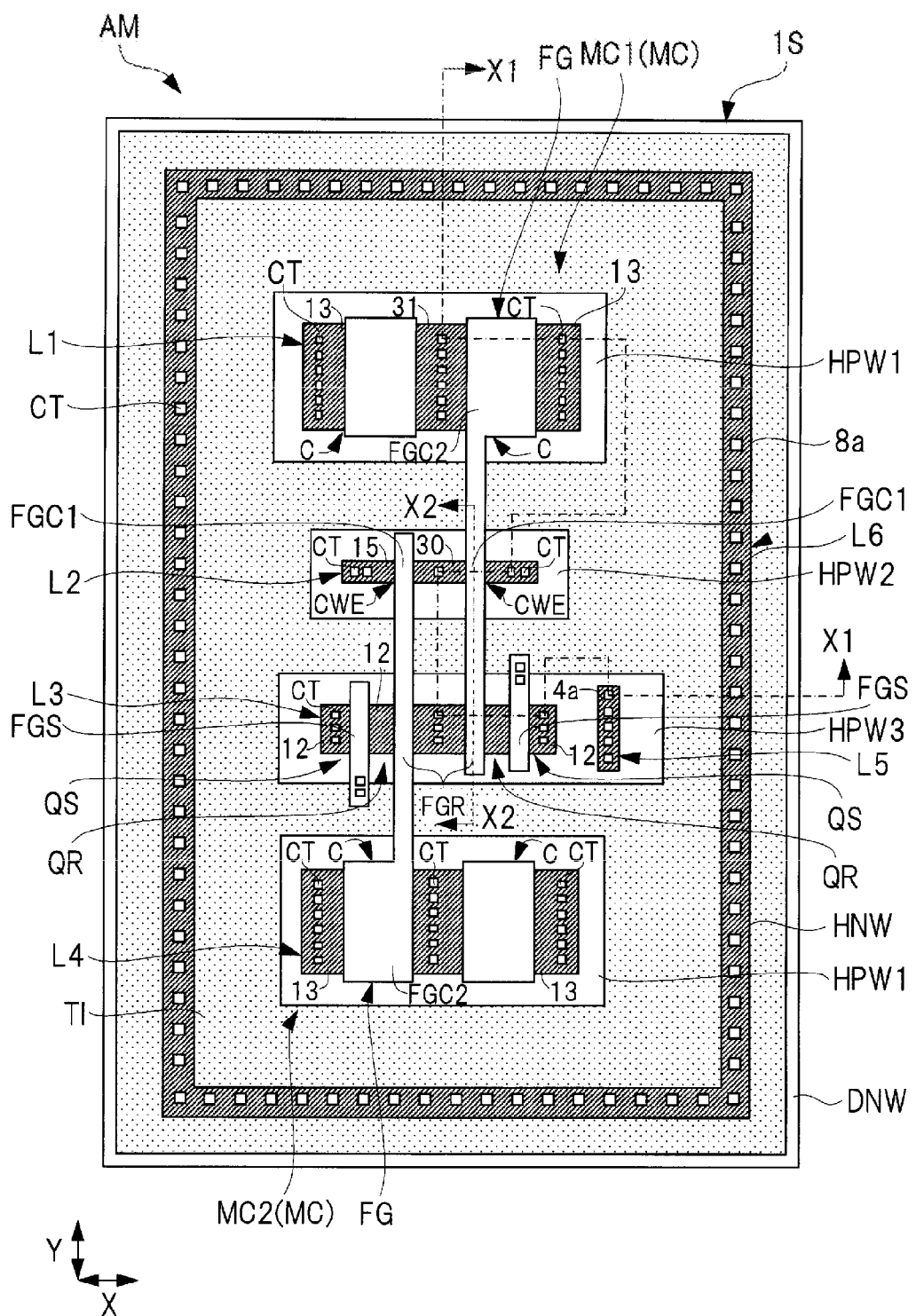
FIG. 1 is a plan view of a nonvolatile memory cell serving as a part of a semiconductor device of an embodiment.

Hereinafter, embodiments will be explained in detail on the basis of the drawings. Note that, in all the drawings for explaining the embodiments, the same symbol is attached to a member having the same function and the repeated explanation thereof is omitted. Furthermore, in the following embodiments, the explanation of the same or a similar portion will not be repeated, in principle, if not particularly necessary.

In addition, in the drawing to be used in the following embodiments, in order to make a drawing visible, hatching may be omitted even if it is a cross-sectional view. Furthermore, in order to make a drawing visible, hatching may be attached even if it is a plan view.

Embodiment

A semiconductor device (semiconductor chip) in an embodiment of the present invention has a major circuit region and a nonvolatile memory region, a major circuit is formed in the major circuit region, and a nonvolatile memory for storing desired data (information) of a comparatively small capacity regarding the major circuit is formed in the nonvolatile memory region. A semiconductor substrate (hereinafter, referred to as a "substrate") 1S constituting this semiconductor chip has a major surface (element formation face, upper face, or surface) where the major circuit and the nonvolatile memory are formed and a rear face opposite to the major surface. Hereinafter, there will be explained a semiconductor device (LCD driver) in which a nonvolatile memory storing desired information regarding the major circuit is formed on the semiconductor chip where an LCD (Liquid Crystal Device) driver circuit is formed as the major circuit. Note that the LCD driver to be described in the present embodiment means a semiconductor device for driving or controlling a display panel such as a liquid crystal display panel.

Figure 2:
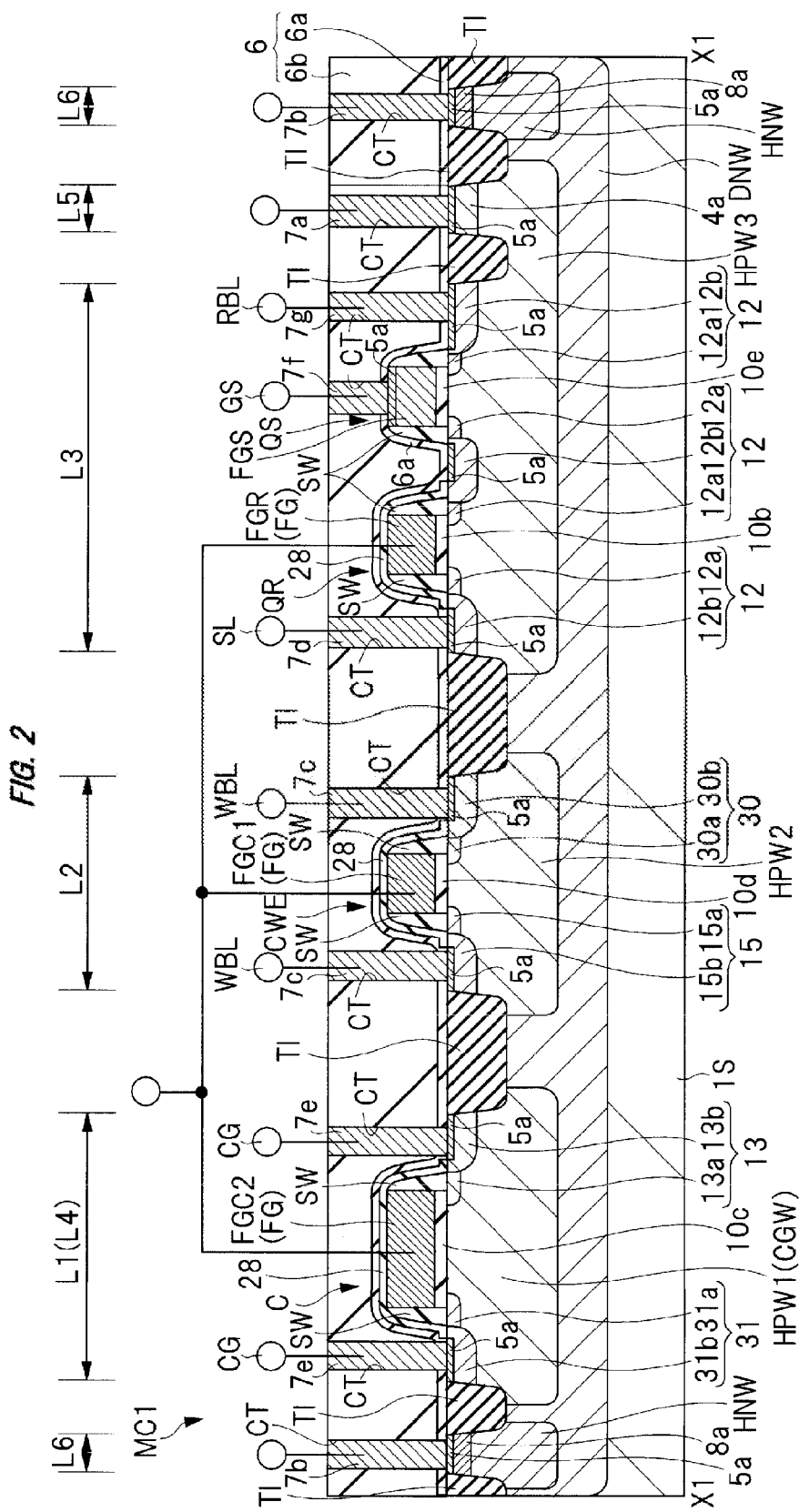
FIG. 2 is a principal part cross-sectional view of a nonvolatile memory cell being a part of a semiconductor device of the present embodiment.
Figure 3:
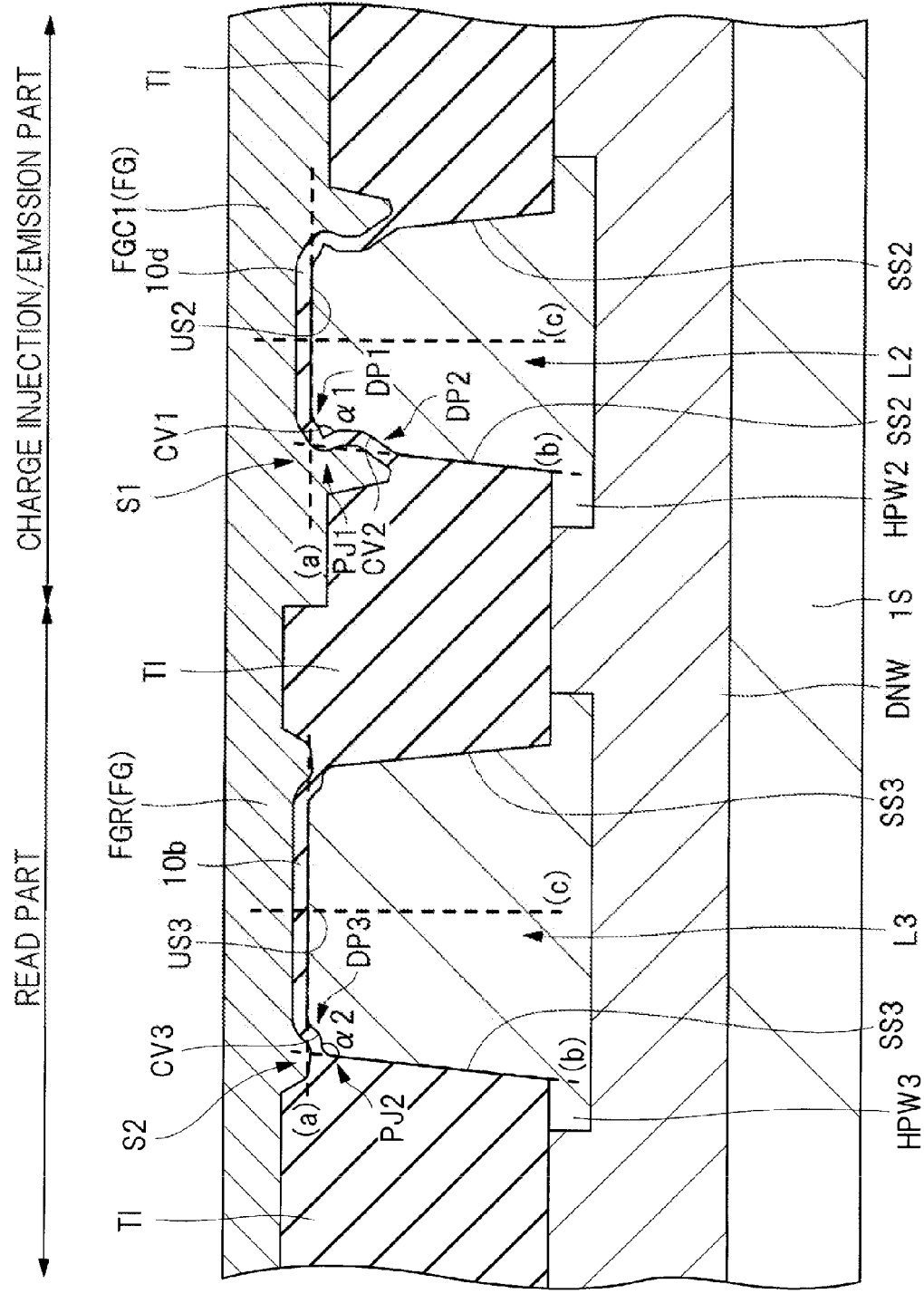
FIG. 3 is a principal part enlarged cross-sectional view of a specific element constituting a nonvolatile memory cell being a part of a semiconductor device of the present embodiment.

FIG. 1 is a plan view of the nonvolatile memory disposed in the nonvolatile memory region AM, and shows 2-bit nonvolatile memory cells (hereinafter, also simply referred to as "memory cells) MC. Furthermore, FIG. 2 and FIG. 3 are cross-sectional views of a nonvolatile memory cell MC1 in the semiconductor device of the present embodiment, and FIG. 2 shows a cross-section along X1-X1 line of FIG. 1 and FIG. 3 shows a cross-section along X2-X2 line of FIG. 1. Note that FIG. 3 is an enlarged cross-sectional view. Furthermore, FIG. 1 is a drawing for easy understanding of the disposition of elements constituting the nonvolatile memory cell, and, for example, an insulating layer, a metal wiring, and the like formed so as to cover the nonvolatile memory cell are omitted.

As shown in FIG. 1, the nonvolatile memory of the present embodiment is provided with a plurality of memory cells MC each constituted of a data write/erase element CWE, a data read element QR, a selection element QS of the memory cells MC, and a capacitance element C which are formed on the major surface of the substrate 1S. The memory cells MC is disposed in a matrix in a first direction Y and a second direction X on the major surface of the substrate 1S. These memory cells MC are disposed in the matrix at positions where un-illustrated bit lines (extending in the first direction Y in the drawing) and word lines (extending in the second direction X in the drawing) intersect with each other.

FIG. 1 shows the memory cell MC1 and a memory cell MC2 disposed adjacent to each other among the memory cells MC formed on the major surface of the substrate 1S. Furthermore, active regions L1 to L6 are disposed on the major surface of the substrate 1S separated electrically from one another. Note that the active region is a region where an element is formed and a region which is sectioned (enclosed) by an element separation region (separation part) composed of an insulating film in a plan view.

In these active regions L1 to L4, a capacitance element C of the memory cell MC1 is formed in the active region L1, and a read element QR and a selection element QS of the memory cell MC1 and a read element QR and a selection element QS of the memory cell MC2 are formed in the active region L3. Furthermore, both of a write/erase element CWE of the memory cell MC1 and a write/erase element CWE of the memory cell MC2 are formed in the active region L2, and a capacitance element C of the memory cell MC2 is formed in the active region L4.

In the present embodiment, the nonvolatile memory storing the desired information regarding the major circuit is formed on the semiconductor chip where the LCD driver circuit is formed as the major circuit. The desired information includes, for example, address information of an effective (usable) element to be used for trimming in the semiconductor chip, disposition address information of an effective memory cell (failure-free memory cell) and an effective LCD element to be used in relieving the memory and LCD, trimming tap information of an adjustment voltage to be used in LCD image adjustment, the manufacturing number of the semiconductor device and the like.

Hereinafter, there will be explained the configurations of the memory cells MC of the present embodiment with reference to the memory cell MC1 of FIG. 1 and by using the cross-sectional views of FIG. 2 and FIG. 3.

As shown in FIG. 2, the separation part TI having a groove shape is formed on the major surface of the p-type substrate 1S so as to define the active regions L1 to L6, and the separation part TI is constituted of the insulating film. P-type (second conduction type) wells HPW1, HPW2, and HPW3 and an n-type well HNW are formed in an n-type (first conductor type) embedded well (first well) DNW formed on this substrate 1S. The p-type wells HPW1, HPW2, and HPW3 are included within the embedded well DNW, and are electrically separated from one another.

These p-type wells HPW1 to HPW3 contain p-type impurities such as bromide (B). A $p^+$-type semiconductor region 4a is formed on the surface of the p-type well HPW3. While the $p^+$-type semiconductor region 4a also contains p-type impurities such as bromide (B), the impurity concentration thereof is set to be higher than the impurity concentration of the p-type well HPW3. This $p^+$-type semiconductor region 4a is electrically coupled to a semiconductor part 7a within a contact hole CT which is formed in an insulating layer 6 over the major surface of the substrate 1S. A silicide layer 5a is formed on a part of the surface layer of the $p^+$-type semiconductor region 4a with which this semiconductor part 7a makes contact.

Furthermore, the n-type well HNW contains n-type impurities such as phosphorus (P) or arsenide (As). An $n^+$-type semiconductor region 8a is formed on a part of the surface layer of this n-type well HNW. While the $n^+$-type semiconductor region 8a contains the n-type impurities, the impurity concentration thereof is set to be higher than the impurity concentration of the n-type well HNW. The $n^+$-type semiconductor region 8a is electrically coupled to a conductor part 7b within a contact hole CT formed in the insulating layer 6. A silicide layer 5a is formed on apart of the surface layer of the $n^+$-type semiconductor region 8a with which this conductor part 7b makes contact. The n-type well HNW formed within the embedded well DNW is a region for supplying a predetermined potential to the embedded well DNW.

The memory cell MC1 of the present embodiment includes the data write/erase element CWE, the data read element QR, and a floating electrode FG constituting a part of the capacitance element C.

The floating electrode FG is a part that accumulates charges contributing to data storage. This floating electrode FG is composed of a conductor film such as polycrystalline silicon, and is formed in an electrically floating state (state insulated from the other conductors). Furthermore, as shown in FIG. 1, this floating electrode FG extends continuously in the first direction Y so as to planarly overlap the p-type wells HPW1, HPW2, and HPW3 which are adjacent to each other.

The write/erase element CWE being a capacitance element for write/erase is disposed at a position where this floating electrode FG planarly overlaps the active region L2 of the p-type well HPW2. As shown in FIG. 2, the write/erase element CWE includes a capacitance electrode FGC1, a capacitance insulating film 10d, an n-type semiconductor region 15, a p-type semiconductor region 30, and the p-type well HPW2.

The capacitance electrode FGC1 is formed by a part of the floating electrode FG, and functions as one electrode of the write/erase element CWE. The capacitance insulating film 10d is made of, for example, silicon oxide, and is formed between the capacitance electrode FGC1 and the substrate 1S (p-type well HPW2). The thickness of the capacitance insulating film 10d is assumed to be, for example, 7 nm or more and 20 nm or less. In the write/erase element CWE of the present embodiment, electrons are injected into the capacitance electrode FGC1 via the capacitance insulating film 10d from the p-type well HPW2 and the electrons of the capacitance electrode FGC1 are emitted into the p-type well HPW2 via the capacitance insulating film 10d when data is rewritten, and thus the thickness of the capacitance insulating film 10d is small and is set to have a thickness of, for example, approximately 13.5 nm.

The n-type semiconductor region 15 and the p-type semiconductor region 30 of the write/erase element CWE are formed at a position obtained by sandwiching the capacitance electrode FGC1 within the p-type well HPW2, in a self-aligned manner with respect to the capacitance electrode FGC1. The n-type semiconductor region 15, the p-type semiconductor region 30, and the p-type well HPW2 are parts constituting one electrode of the write/erase element CWE. That is, in the write/erase element CWE, the conduction type is different between the semiconductor regions on the left side and the right side of the capacitance electrode FGC1. By such a configuration, it is possible to suppress or prevent the formation of a depletion layer in the substrate 1S when the data is erased or written.

The n-type semiconductor region 15 includes an $n^-$-type semiconductor region 15a on a channel side and an $n^+$-type semiconductor region 15b electrically coupled to this semiconductor region 15a. While these $n^-$-type semiconductor region 15a and $n^+$-type semiconductor region 15b contain n-type impurities such as phosphorous (P) and arsenide (As), the impurity concentration of the $n^+$-type semiconductor region 15b is set to be higher than the impurity concentration of the $n^-$-type semiconductor region 15a.

Furthermore, the p-type semiconductor region 30 includes a $p^-$-type semiconductor region 30a on the channel side and a $p^+$-type semiconductor region 30b electrically coupled to this $p^-$-type semiconductor region 30a. While these $p^-$-type semiconductor region 30a and $p^+$-type semiconductor region 30b contain p-type impurities such as boron (B), the impurity concentration of the $p^+$-type semiconductor region 30b is set to be higher than the impurity concentration of the $p^-$-type semiconductor region 30a.

Each of the $n^-$-type semiconductor region 15a and the $p^-$-type semiconductor region 30a extends from around one end of the capacitance electrode FGC1 along the major surface of the substrate 1S approximately by the width of a side wall SW to thereby terminate. The $n^+$-type semiconductor region 15b and the $p^+$-type semiconductor region 30b partially overlap at respective termination ends of the $n^-$-type semiconductor region 15a and $p^-$-type semiconductor region 30a, and extend from the overlap positions along the major surface of the substrate 1S by desired lengths to terminate at the separation part TI. This p-type semiconductor region 30 is electrically coupled to the p-type well HPW2, and is a region for supplying a predetermined potential to the p-type well HPW2.

These n-type semiconductor region 15 and p-type semiconductor region 30 are electrically coupled to conductor parts 7c within contact holes CT formed in the insulating layer 6. These conductor parts 7c are electrically coupled to a data write/erase bit line WBL. Silicide layers 5a are formed on parts of the surface layers of the $n^+$-type semiconductor region 15b and the $p^+$-type semiconductor region 30b with which these conductor parts 7c make contact.

Furthermore, the data read element QR is disposed at a position where the floating electrode FG planarly overlaps the active region L3 of the p-type well HPW3. As shown in FIG. 2, the read element QR includes a gate electrode FGR, a gate insulating film 10b, and a pair of n-type semiconductor regions 12. The channel of the read element QR is formed on the surface of the p-type well HPW3 where the gate electrode FGR and the active region L3 planarly overlap each other.

The gate electrode FGR is formed by a part of the floating electrode FG. The gate insulating film 10b is made of silicon oxide, for example, and formed between the gate electrode FGR and the substrate 1S (p-type well HPW3). The thickness of the gate insulating film 10b is equal to the thickness of the capacitance insulating film 10d, and is, for example, approximately 13.5 nm. The pair of n-type semiconductor regions 12 of the read element QR are formed at positions obtained by sandwiching the gate electrode FGR within the p-type well HPW3, in self-aligned manner with respect to the gate electrode FGR. Each of the pair of n-type semiconductor regions 12 in the data read element QR includes an $n^-$-type semiconductor region 12a on the channel side and an $n^+$-type semiconductor region 12b electrically coupled to each of the n-type semiconductor regions. While these $n^-$-type semiconductor region 12a and $n^+$-type semiconductor region 12b contain n-type impurities such as phosphorous (P) and arsenide (As), the impurity concentration of the $n^+$-type semiconductor region 12b is set to be higher than the impurity concentration of the $n^-$-type semiconductor region 12a.

One of semiconductor regions 12 in the read element QR like this is electrically coupled to a conductor part 7d within a contact hole CT formed in the insulating layer 6. This conductor part 7d is electrically coupled to a source line SL. A silicide layer 5a is formed over a part of the surface layer of the $n^+$-type semiconductor region 12b with which this conductor part 7d makes contact. On the other side, the other one of the semiconductor regions 12 of the read element QR is also commonly used as one of n-type semiconductor regions 12 for the source and the drain of a selection MIS (Metal Insulator Semiconductor) transistor (selection element) QS.

The selection MIS transistor QS includes a gate electrode FGS, a gate insulating film 10e, and a pair of source-drain n-type semiconductor regions 12. The channel of the selection MIS transistor QS is formed on the surface of the p-type well HPW3 where the gate electrode FGS and the active region L3 planarly overlap each other.

The gate electrode FGS is formed of, for example, low-resistance polycrystalline silicon, and is electrically separated from the floating electrode FG. This gate electrode FGS is electrically coupled to a conductor part 7f within a contact hole CT formed in the insulating layer 6. This contact hole CT is shown in FIG. 2 for easy understanding, while not to be shown as a cross-section along X1-X1 line of FIG. 1. The conductor part 7f is electrically coupled to a selection line GS.

The gate insulating film 10e is made of, for example, silicon oxide, for example, and formed between the gate electrode FGS and the substrate 1S (p-type well HPW3). The thickness of this gate insulating film 10e is equal to each of the thicknesses of the gate insulating film 10b and the capacitance insulating film 10d, and is, for example, approximately 13.5 nm. Each of the configurations in the pair of n-type semiconductor regions 12 in the selection MIS transistor QS is the same as that of the n-type semiconductor region 12 of the read element QR. The other n-type semiconductor region 12 of the selection MIS transistor QS is electrically coupled to a conductor part 7g within a contact hole CT formed in the insulating layer 6. This conductor part 7g is electrically coupled to a data read bit line RBL. A silicide layer 5a is formed on a part of the surface layer of an n$^+$-type semiconductor region 12b with which this conductor part 7g makes contact.

Furthermore, the capacitance element C is formed at a position where the floating electrode FG planarly overlaps the p-type well HPW1. This capacitance element C includes the p-type well HPW1 being a control gate electrode CGW, a capacitance electrode FGC2, a capacitance insulating film 10c, a p-type semiconductor region 13, and an n-type semiconductor region 31.

The capacitance electrode FGC2 is formed in a part of the floating electrode FG facing the control gate electrode CGW, and functions as one electrode of the capacitance element C. It is possible to realize production matching easily between the memory cell MC1 of the nonvolatile memory and major circuit elements by having the single layer gate configuration of the memory cell MC1 in this way, and thus it is possible to realize manufacturing time reduction and manufacturing cost reduction of the semiconductor device.

In addition, a length (width) in the second direction X of the capacitance electrode FGC2 is formed larger than each of the lengths (widths) in the second direction X of the capacitance electrode FGC1 of the write/erase element CWE and the gate electrode FGR of the read element QR, and the floating electrode FG has a flag-like planar shape as shown in FIG. 1.

Furthermore, the capacitance insulating film 10c is made of, for example, silicon oxide, and formed between the capacitance electrode FGC2 and the substrate 1S (p-type well HPW1). The capacitance insulating film 10c has a thickness equal to each of the thicknesses of the gate insulating films 10b and 10e and the capacitance insulating film 10d, and the thickness is, for example, approximately 13.5 nm.

Moreover, the pair of p-type semiconductor region 13 and n-type semiconductor region 31 of the capacitance element C are formed at positions obtained by sandwiching the capacitance electrode FGC2 within the p-type well HPW1, in a self-aligned manner with respect to the capacitance electrode FGC2. The p-type semiconductor region 13, the n-type semiconductor region 31, and the p-type well HPW1 are parts constituting one electrode of the capacitance element C. That is, in the capacitance element C, the conduction type is different between the semiconductor regions on the left and right side of the capacitance electrode FGC2. By such a configuration, it is possible to suppress or prevent the formation of a depletion layer in the substrate 1S when data is erased or written.

The semiconductor region 13 includes a p$^-$-type semiconductor region 13a on the channel side, and a p$^+$-type semiconductor region 13b electrically coupled to this semiconductor region 13a. While the p$^-$-type semiconductor region 13a and p$^+$-type semiconductor region 13b include p-type impurities such as boron (B), the impurity concentration of the p$^+$-type semiconductor region 13b is set to be higher than the impurity concentration of the p$^-$-type semiconductor region 13a. This p-type semiconductor region 13 is electrically coupled to the p-type well HPW1.

Furthermore, the n-type semiconductor region 31 includes an n$^-$-type semiconductor region 31a on the channel side, and an n$^+$-type semiconductor region 31b electrically coupled to this n$^-$-type semiconductor region 31a. While these n$^-$-type semiconductor region 31a and the n$^+$-type semiconductor region 31b include n-type impurities such as phosphorous (P) and arsenide (As), the impurity concentration of the n$^+$-type semiconductor region 31b is set to be higher than the impurity concentration of the n$^-$-type semiconductor region 31a.

Each of the p$^-$-type semiconductor region 13a and the n$^-$-type semiconductor region 31a extend from around one end of the capacitance electrode FGC2 along the major surface of the substrate 1S by approximately the width of a side wall SW to thereby terminate. The p$^+$-type semiconductor region 13b and the n$^+$-type semiconductor region 31b partially overlap at respective termination ends of the p$^-$-type semiconductor region 13a and the n$^-$-type semiconductor region 31a, and extend from the overlap positions along the major surface of the substrate 1S by desired lengths to thereby terminate at the separation part TI.

In the present embodiment, the n-type semiconductor region 31 is formed between two floating electrodes FG adjacent to each other as shown in FIG. 1. Namely, the n-type semiconductor region 31 serves as a common region of two capacitance elements C.

These p-type semiconductor region 13 and n-type semiconductor region 31 are electrically coupled to conductor parts 7e within contact holes CT formed in the insulating layer 6. These conductor parts 7e are electrically coupled to a control gate wiring CG. Silicide layers 5a are formed on parts of the surface layers of the p$^+$-type semiconductor region 13b and the n$^+$-type semiconductor region 31b with which these conductors parts 7e make contact.

As apparent from FIG. 1 and FIG. 2, the lengths of the capacitance electrode FGC2 in the first direction Y and the second direction X are set to be larger than the lengths of the capacitance electrode FGC1 of the write/erase element CWE in the first direction Y and the second direction X. Namely, the capacitance value of a first capacitance constituted of the capacitance electrode FGC2, the capacitance insulating film 10c, and the well HPW1 is set to be approximately 10 times larger than the capacitance value of a second capacitance constituted of the capacitance electrode FGC1, the capacitance insulating film 10d and the well HPW2. BY such a configuration, it is possible to increase the coupling capacitance ratio of the first capacitance with respect to the second capacitance and to supply a voltage supplied from the control gate wiring CG effectively to the second capacitance, and thus it becomes possible to enhance voltage supply efficiency.

Next, there will be further explained structures of the write/erase element CWE and the read element QR by using FIG. 3. FIG. 3 shows a cross-section of the floating electrode FG along the extension direction, and expresses the write/erase element CWE as a charge injection/emission part and expresses the read element QR as a read part.

In the charge injection/emission part, the separation part TI is formed in contact with side walls SS2 so as to surround the active region L2. The capacitance insulating film 10d is formed on the surface US2 (upper face) of the active region L2, the capacitance electrode FGC1 (FG) is formed over the capacitance insulating film 10d. In the active region L2, the intersection part of an imaginary straight line (a) along the surface US2 and an imaginary straight line (b) along a side wall SS2 is referred to as a shoulder part S1 of the active region L2. The shoulder part S1 is provided with a protrusion part PJ1. The protrusion part PJ1 is formed by the intersection of a concave part DP1 with respect to the surface US2 of the active region L2 and a concave part DP2 with respect to the side wall SS2. The concave part DP2 is located at a position more apart from the surface US2 of the active region L2 than the concave part DP1. That is, the concave part DP1 is located on the upper side and the concave part DP2 is located on the lower side of the concave part DP1. The concave part DP1 is recessed to side of the active region L2 with respect to the imaginary straight line (a), and the concave part DP2 is recessed to the side of the active region L2 with respect to the imaginary straight line (b). The protrusion part PJ1 is formed at an intersection part of a pseudo arc cv1 constituting the concave part DP1 and a pseudo arc CV2 constituting the concave part DP2, and the pseudo arc cv1 and the pseudo arc cv2 forms an angle α1 (referred to as angle of the protrusion part PJ1). Each of the pseudo arc cv1 and the pseudo arc cv2 has a convexity to the side of the active region L2. The protrusion part PJ1, and the shoulder part S1 of the active region L2 including the pseudo arc cv1 and the pseudo arc cv2 are covered by the capacitance electrode FGC1 via the capacitance insulating film 10d. Furthermore, an imaginary straight line (c) is located at the center of the active region L2, and the active region L2 has a structure having left-right symmetry with respect to the imaginary straight line (c).

In the read part, the separation part TI is formed in contact with side walls SS3 so as to surround the active region L3. The gate insulating film 10b is formed on the surface US3 (upper face) of the active region L3, and the capacitance electrode FGR (FG) is formed over the gate insulating film 10b. In the active region L3, the intersection part of an imaginary straight line (a) along the surface US3 and an imaginary straight line (b) along a side wall SS3 is referred to as a shoulder part S2 of the active region L3. The shoulder part S2 is provided with a protrusion part PJ2. The protrusion part PJ2 is formed by the intersection of a concave part DP3 with respect to the surface US3 of the active region L3 and a side wall SS3. The concave part DP3 is recessed to the side of the active region L3 with respect to the imaginary straight line (a). The protrusion part PJ2 is formed at an intersection part of a pseudo arc cv3 constituting the concave part DP3 and the imaginary straight line (b) along the side wall SS3, and the pseudo arc cv3 and the imaginary straight line (b) forms an angle α2 (referred to as angle of the protrusion part PJ2). Furthermore, an imaginary straight line (c) is located at the center of the active region L3, and the active region L3 has a structure having left-right symmetry with respect to the imaginary straight line (c). Moreover, since the concave part DP3 is formed in the shoulder part S2 of the active region L3, it is possible to prevent the generation of kink characteristics in the read element QR formed in the read part. Note that the selection element QS and the capacitance element C constituting the memory cell MC1 have the same structure as the read part.

Here, the angle α1 of the protrusion part PJ1 is smaller than the angle α2 of the protrusion PJ2 (α1<α2). Namely, the protrusion PJ1 has a more pointed shape (structure) than the protrusion PJ2.

Next, there will be explained an operation example of the nonvolatile memory in the present embodiment by using FIG. 2 and FIG. 3. Here, the write, erase, and read of the memory cell MC1 will be explained when the memory cell MC1 is selected. As shown in FIG. 2, each of the memory cells MC is electrically coupled with the data write/erase bit line WBL and the data read bit line RBL which extend in the first direction Y, and the control gate wiring (word line) CG, the source line SL, and the selection line GS which extend in the second direction X. Specifically, one electrode of the data write/erase element CWE is electrically coupled to the data write/erase bit line WBL. Furthermore, the other electrode FGC1 (floating electrode FG) of the data write/erase element CWE is electrically coupled to the gate electrode FGR (floating electrode FG) of the data read element QR and also electrically coupled to one electrode FGC2 (floating electrode FG) of the capacitance element C. Then, the other electrode of the capacitance element C (control gate electrode CGW shown in FIG. 2) is electrically coupled to the control gate wiring CG. On the other side, the drain of the data read element QR is electrically coupled to the data read bit line RBL via the selection MIS transistor QS, and the source is electrically coupled to the source line SL. The gate electrode of the selection MIS transistor QS is electrically coupled to the selection line GS.

There will be explained an applied voltage to each part in data write operation with reference to FIG. 2.

Here, a voltage of, for example, 9 V, for example, is applied to the n-type well HNW and the n-type embedded well DNW through the conductor part 7b, and the n-type well HNW and the n-type embedded well DNW are electrically separated from the p-type substrate 1S and the p-type wells HPW1 to HPW3. Furthermore, a positive control voltage of, for example, 9V is applied to the control gate electrode CGW of the capacitance element C through the conductor parts 7e from the control gate wiring CG. Moreover, a negative voltage of, for example, −9 V is applied to one of the electrodes of the write/erase element CWE (p-type semiconductor region 30 and p-type well HPW2) through the conductor parts 7c from the data write/erase bit line WBL. At this time, the capacitance electrode FGC1 has a positive potential of approximately 9 V according to a capacitance ratio of the above first capacitance and the second capacitance. Namely, the capacitance electrode FGC1 has a positive potential of approximately 18V with respect to the p-type well HPW2. In addition, for example, 0 V is applied to the p-type well HPW3 through the conductor part 7a. Furthermore, for example, 0 V is applied to the gate electrode FGS of the selection MIS transistor QS through the conductor part 7f from the selection line GS. Moreover, for example, 0 V is applied to one of the n-type semiconductor regions 12 of the data read element QR through the conductor part 7d from the source line SL. In addition, for example, 0 V is applied to one of the n-type semiconductor regions 12 of the selection MIS transistor QS through the conductor part 7g from the data read bit line RBL.

Thereby, electrons in the p-type well HPW2 of the data write/erase element CWE in the memory cell MC1 is injected into the capacitance electrode FGC1 (floating electrode FG) by FN tunnel current through the capacitance insulating film 10d, and the data is written. The above write voltages are applied to the respective elements for a predetermined time so that the threshold value of the read element QR falls within a predetermined range, and the write operation is completed.

Here, as shown in FIG. 3, the shoulder part S1 of the active region L2 where the data write/erase element CWE (corresponding to the charge injection/emission part) is formed has the pointed protrusion part PJ1, the FN tunnel current flows easily through the protrusion part PJ1, and thus high speed data write becomes possible. This is because the thickness of the capacitance insulating film 10d becomes apparently smaller by the concentration of an electric field at the pointed protrusion part PJ1.

Furthermore, in the data write, each of the memory cells MC in which the read element QR does not reach a predetermined threshold value is determined to be a memory cell having write failure. Even when the write operation is performed for the predetermined time, a memory cell MC having the write failure exists because of shape variation of a shoulder part S1 in an active region L2 among the memory cells MC, which is a factor of degrading a write yield. Since the high speed data write is possible in the memory cells MC of the present embodiment, it is possible to enhance the write yield.

There will be explained an example of bit-by-bit data erase operation.

Explaining an applied voltage to each part in data erase operation with reference to FIG. 2, here, a voltage of, for example, 9 v is applied to the n-type well HNW and the n-type embedded well DNW through the conductor part 7b, and the n-type well HNW and the n-type embedded well DNW are electrically separated from the substrate 1S and the p-type wells HPW1 to HPW3. In addition, a negative voltage of, for example, −9 v is applied to the control gate electrode CGW of the capacitance element C through the conductor parts 7e from the control gate wiring CG. Furthermore, a positive voltage of, for example, 9 v is applied to one of the electrodes (p-type semiconductor region 30 and p-type well HPW2) of the write/erase element CWE through the conductor parts 7c from the data write/erase bit line WBL. Moreover, for example, 0 V is applied to the p-type well HPW3 through the conductor part 7a. In addition, for example, 0 V is applied to the gate electrode FGS of the selection MIS transistor QS through the conductor part 7f from the selection line GS. Furthermore, for example, 0 V is applied to one of the n-type semiconductor regions 12 of the data read element QR through the conductor part 7d from the source line SL. Moreover, for example, 0 V is applied to one of the n-type semiconductor regions 12 of the selection MIS transistor QS through the conductor part 7g from the data read bit line RBL.

Thereby, electrons accumulated in the capacitance electrode FGC (floating electrode FG) of the data write/erase element CWE in the memory cell MC1 is emitted to the p-type well HPW2 through the capacitance insulating film 10d by the FN tunnel current across the whole channel plane, and the data is erased.

There will be explained an example of a data read operation.

Explaining an applied voltage to each part in data read operation with reference to FIG. 2, here, a voltage of, for example, 3 v is applied to the n-type well HNW and the n-type embedded well DNW through the conductor part 7b, and thus the n-type well HNW and the n-type embedded well DNW are electrically separated from the substrate 1S and the p-type wells HPW1 to HPW3. In addition, a positive voltage of, for example, 3 v is applied to the control gate electrode CGW of the capacitance element C through the conductor parts 7e from the control gate wiring CG. Thereby, a positive voltage is applied to the gate electrode FGR of the data read element QR. Furthermore, for example, 0 V is applied to the p-type well HPW3 through the conductor part 7a. Moreover, for example, 3 V is applied to the gate electrode FGS of the selection MIS transistor QS through the conductor part 7f from the selection line GS. In addition, for example, 0 V is applied to one of the n-type semiconductor regions 12 of the data read element QR through the conductor part 7d from the source line SL. Furthermore, for example, 1 V is applied to one of the n-type semiconductor regions 12 of the selection MIS transistor QS through the conductor part 7g from the data read bit line RBL. Moreover, for example, 0 V is applied to one of the electrodes (p-type semiconductor region 30 and p-type well HPW2) of the write/erase element CWE through the conductor parts 7c from the data write/erase bit line WBL.

Thereby, when the data read element QR in the memory cell MC1 is turned on, the data 1/0 stored in a selected memory cell MCs is read depending on whether or not drain current flows in the channel of the data read element QR.

Next, there will be explained an example of a semiconductor manufacturing method of the present embodiment with reference to FIG. 4 to FIG. 18.

FIG. 4 to FIG. 9 are principal part cross-sectional views of the substrate 1S (here, semiconductor thin plate having a planar circular shape referred to as a semiconductor wafer) during a manufacturing process of the semiconductor device in the present embodiment. FIG. 4 to FIG. 9 show elements constituting the memory cell MC1 of a nonvolatile memory. The capacitance element C, the write/erase element CWE, the read element QR, and selection element QS are formed in the capacitance part (corresponding to L1 of FIG. 2), the charge injection/emission part (corresponding to L2 of FIG. 2), the read part, and the selection part (corresponding to L3 of FIG. 2) on the major surface of the substrate 1S, respectively. While FIG. 4 to FIG. 9 correspond to the cross-section of FIG. 2, the part of the active region L6 in FIG. 2 is omitted.

Figure 4:
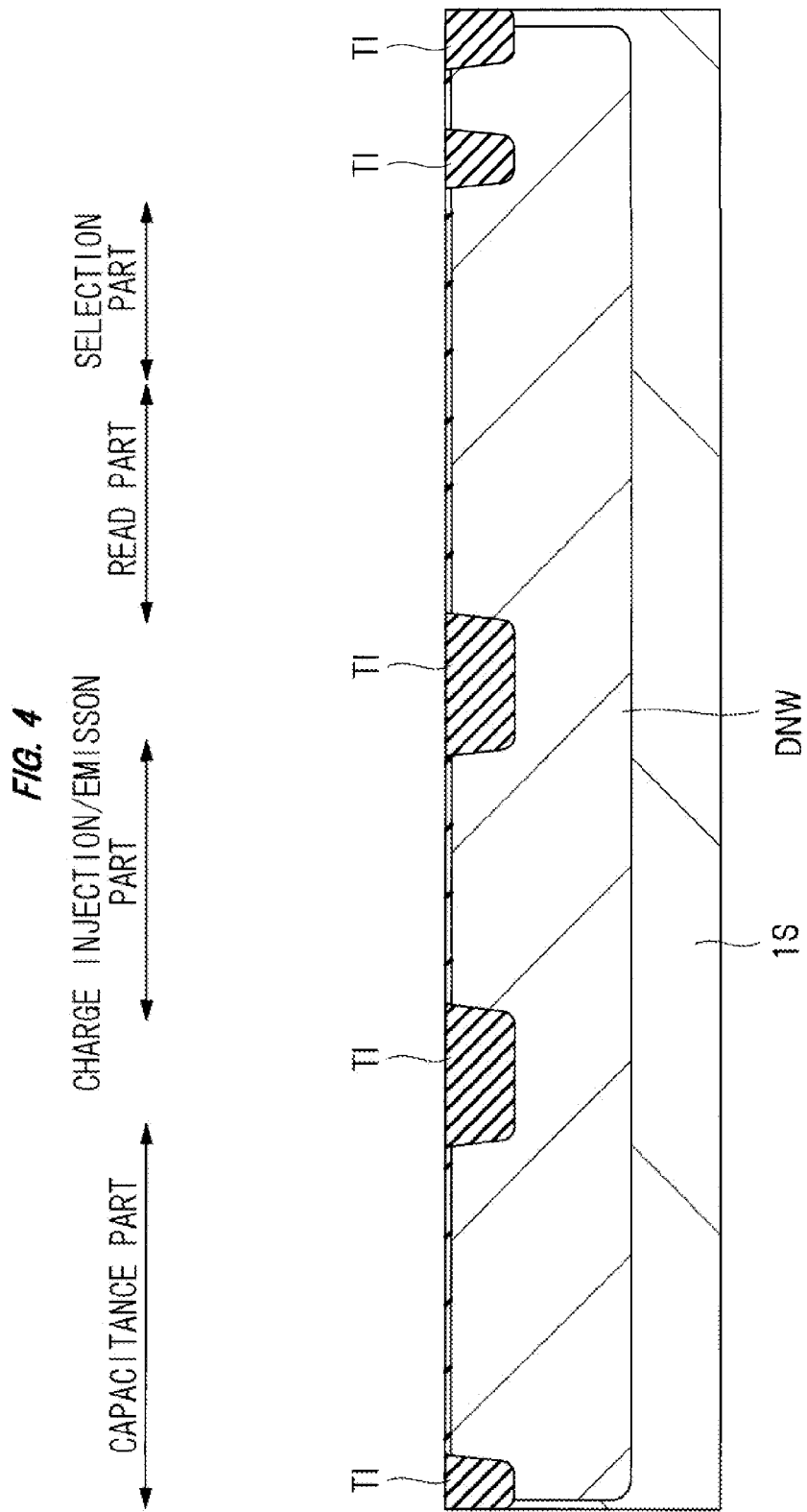
FIG. 4 is a principal part cross-sectional view showing a manufacturing method of a semiconductor device of the present embodiment.

First, as shown in FIG. 4, the substrate 1S (semiconductor wafer or semiconductor substrate) constituted of the p-type silicon substrate is prepared, and the n-type embedded well DNW is formed so as to integrally surround the capacitance part, the charge injection/emission part, the read part, and the selection part. The formation is carried out by a photolithography (hereinafter, simply referred to as lithography) process, an ion implantation process, and the like. The lithography process is a series of processes for forming a desired resist pattern by photo-resist (hereinafter, simply referred to as resist) film coating, exposure, development and the like. In the ion implantation process, desired impurities are selectively introduced into a desired portion of the substrate 1S by using a resist pattern formed over the major surface of the substrate 1S through the lithography process, as a mask. The resist pattern here is assumed to be a pattern which exposes an impurity introduction region and covers the region excluding the impurity introduction region.

Subsequently, after the separation groove has been formed in the separation region on the major surface of the substrate 1S, the separation part TI constituted of the insulating film and having a groove shape is formed by embedding the insulating film into the separation groove. Thereby, the active region is specified. Namely, in a plan view, each of the capacitance element C, the write/erase element CWE, the read element QR, and the selection element QS is surrounded by the separation part TI.

Figure 5:
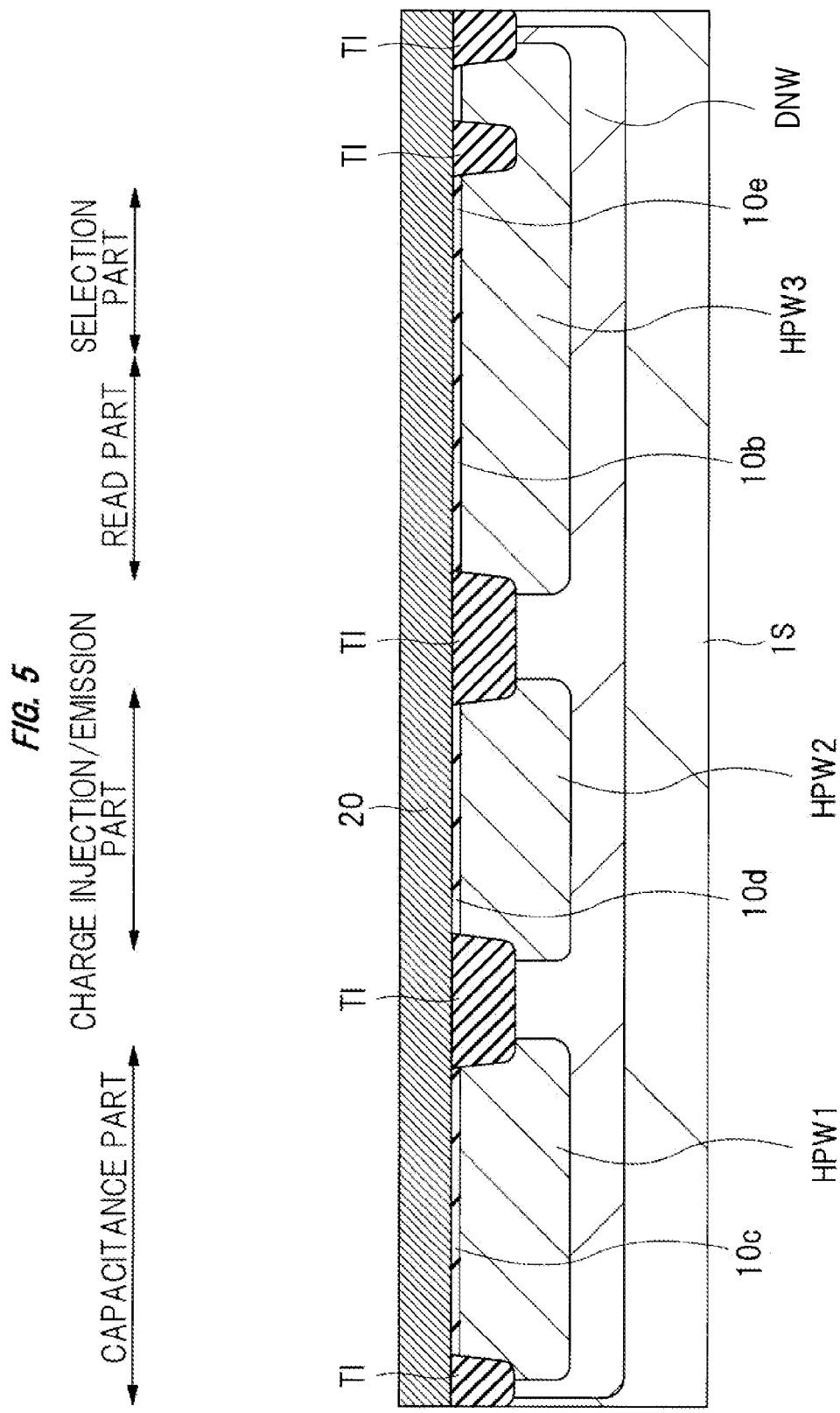
FIG. 5 is a principal part cross-sectional view subsequent to FIG. 4, during a manufacturing method of a semiconductor device of the present embodiment.

Then, as shown in FIG. 5, the p-type wells HPW1 to HPW3 are formed at the same time by a lithography process, an ion implantation process, and the like in the formation region of the memory cell MC1. There is surrounded, by the n-type embedded well DNW, each of the n-type embedded well DNW surrounds each of the p-type well HPW1 where the capacitance element C is formed, the p-type well HPW2 where the write/erase element CWE is formed, and the p-type well HPW3 where the read element QR and the selection element QS are formed. Namely, the p-type wells HPW1 to HPW3 can be electrically independent from one another.

After that, after the gate insulating films 10b and 10e and the capacitance insulating films 10c and 10d have been formed by a thermal oxidation method or the like, a conductor film 20 made of, for example, low-resistance polycrystalline silicon is formed by a CVD (Chemical Vapor Deposition) method or the like over the major surface of the substrate 1S (semiconductor wafer). Here, the gate insulating films 10b and 10e and the capacitance insulating films 10c and 10d are formed each having the same thickness.

Figure 6:
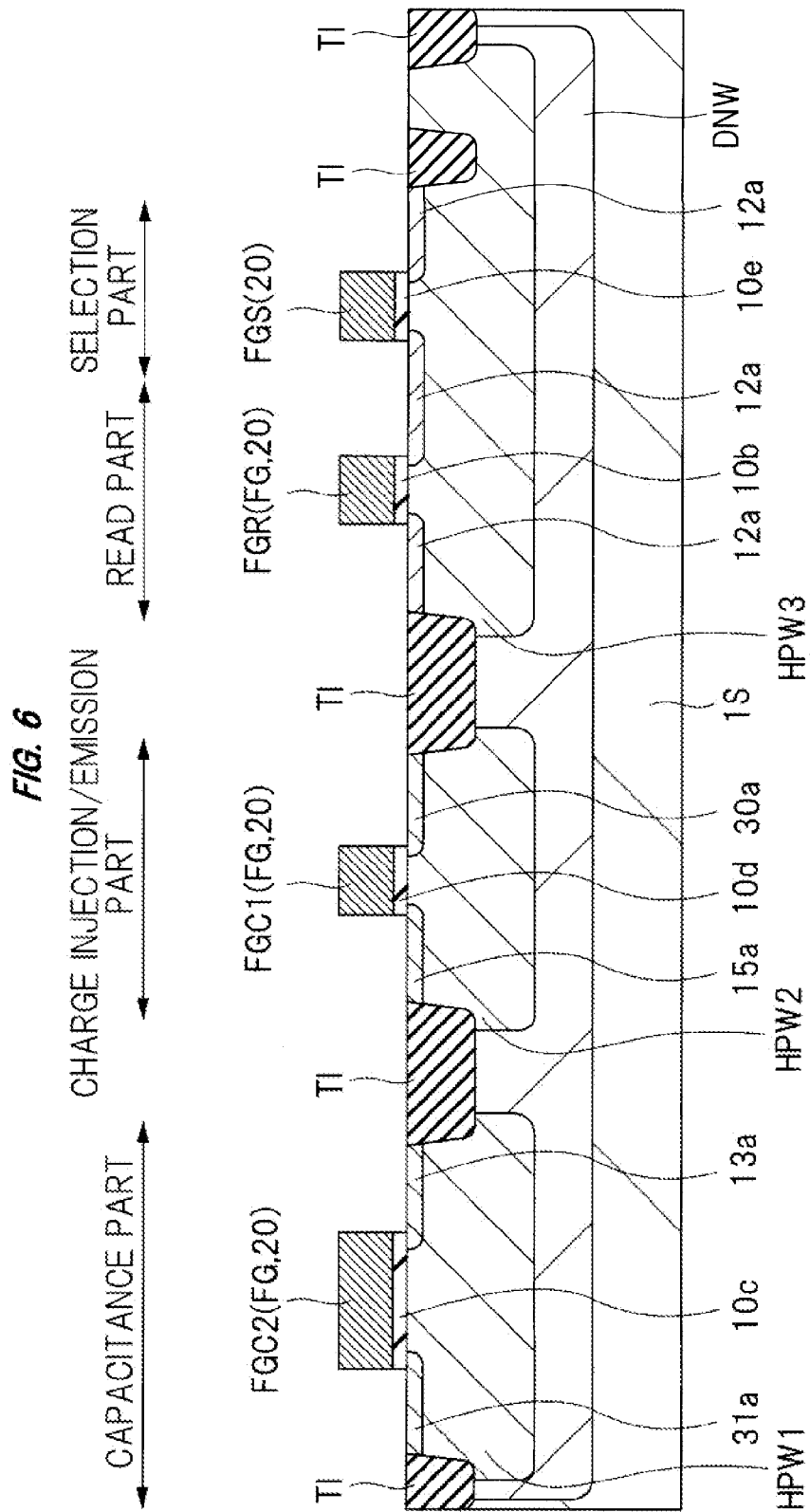
FIG. 6 is a principal part cross-sectional view subsequent to FIG. 5, during a manufacturing process of a semiconductor device.

Next, as shown in FIG. 6, the conductor film 20 is patterned by a lithography process and an etching process, and the gate electrode FGS and the floating electrode FG (gate electrode FGR and capacitance electrodes FGC1 and FGC2) are formed.

Then, the p$^-$-type semiconductor regions 13a and 30a are formed at the same time in the formation region of the capacitance element C and the formation region of the data write/erase element CWE by a lithography process, an ion implantation process, and the like. Subsequently, the n$^-$-type semiconductor regions 31a, 15a, and 12a are formed at the same time in the formation region of the capacitance element C, the formation region of the data write/erase element CWE, and in the formation regions of the data read element QR and the selection MIS transistor QS by a lithography process, an ion implantation process, and the like.

Figure 7:
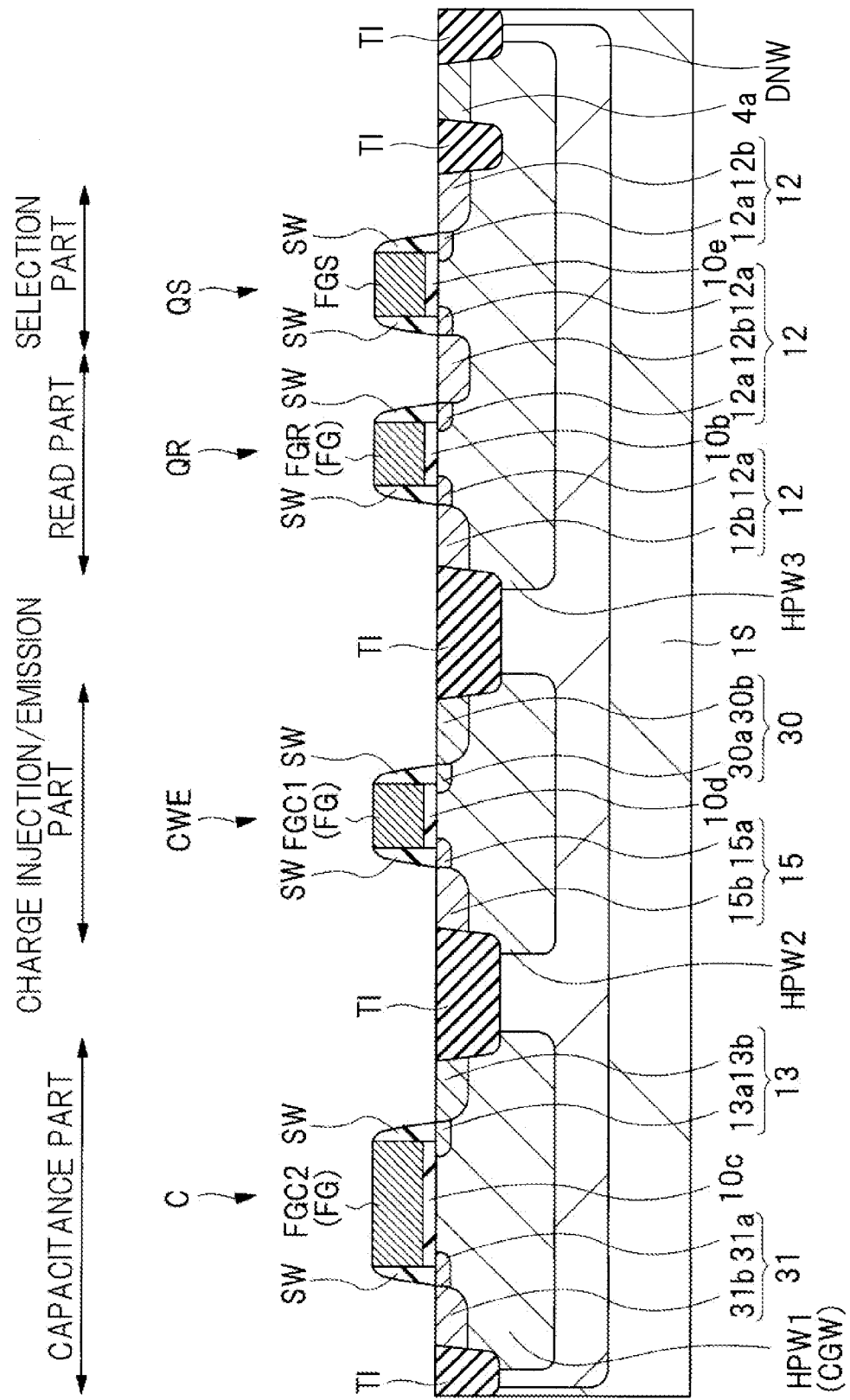
FIG. 7 is a principal part cross-sectional view subsequent to FIG. 6, during a manufacturing process of a semiconductor device.

After that, as shown in FIG. 7, after an insulating film made of, for example, silicon oxide has been deposited over the major surface of the substrate 1S (semiconductor wafer) by a CVD method or the like, the side walls SW are formed on the side faces of the gate electrodes FGR and FGS and the capacitance electrodes SFGC1 and FGC2 by applying etchback by anisotropic dry-etching for the insulating film.

Next, the p$^+$-type semiconductor regions 13b, 30b, and 4a are formed at the same time in the capacitance part, the charge injection/emission part, and a lead region of the p-type well HPW3 by a lithography process, an ion implantation process, and the like. Thereby, the p-type semiconductor region 13 is formed in the capacitance part. Furthermore, the p-type semiconductor region 30 is formed in the charge injection/emission part.

Then, the n$^+$-type semiconductor regions 31b, 15b, and 12b are formed at the same time in the capacitance part, the charge injection/emission part, the read part, and the n-channel type MIS transistor formation region in the selection part by a lithography process, an ion implantation process, and the like. Thereby, the n-type semiconductor region 31 is formed in the capacitance part, and the capacitance element C is formed. Furthermore, the n-type semiconductor region 15 is formed in the charge injection/emission part, and the data write/erase element CWE is formed. Moreover, the n-type semiconductor regions 12 are formed in the read part and the selection part, and the data read element QR and the selection MIS transistor QS are formed.

Figure 8:
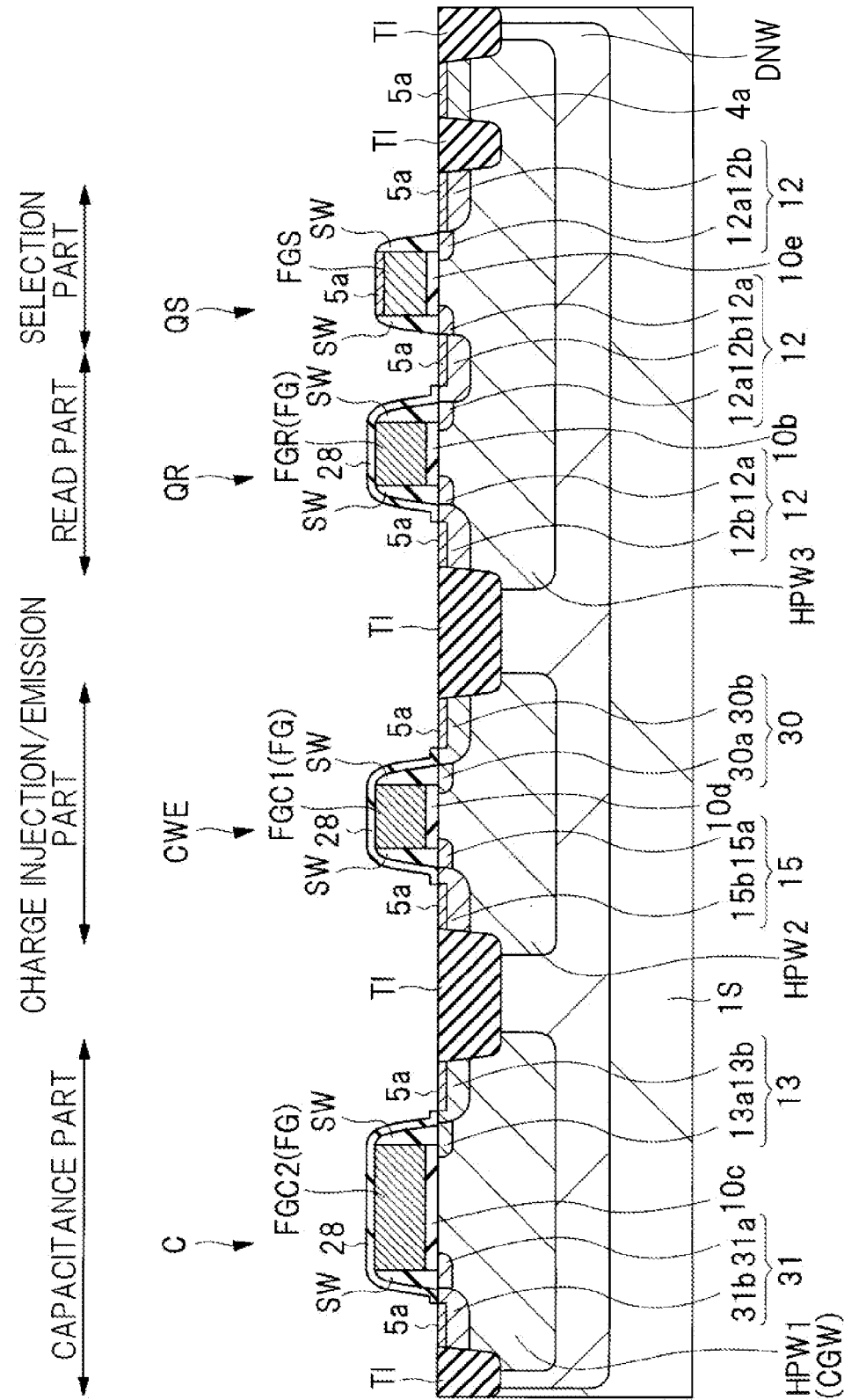
FIG. 8 is a principal part cross-sectional view subsequent to FIG. 7, during a manufacturing process of a semiconductor device.

Subsequently, as shown in FIG. 8, the silicide layer 5a is selectively formed. Before the formation process of this silicide layer 5a, in the region of the memory cell MC1, an insulating film 28 is formed on the upper face of the floating electrode FG (capacitance electrodes FGC1 and FGC2 and gate electrode FGR), and thus the silicide layers 5a are constituted not to be formed in this portion. Namely, the silicide layer 5a is formed over the gate electrode FGS of the selection element QS, and the silicide layer 5a is not formed over the floating gate electrodes (FGC2, FGC1, and FGR) in the capacitance part, the charge injection/emission part, or the read part. Note that the insulating film 28 is formed of, for example, a silicon oxide film.

This insulating film 28 extends from an end part of the side wall SW in each of the floating electrodes FG in the gate length direction, and the silicide layers 5a are formed on the semiconductor regions 31b, 13b, 15b, 30b, and 12b which are exposed from the insulating film 28.

Figure 9:
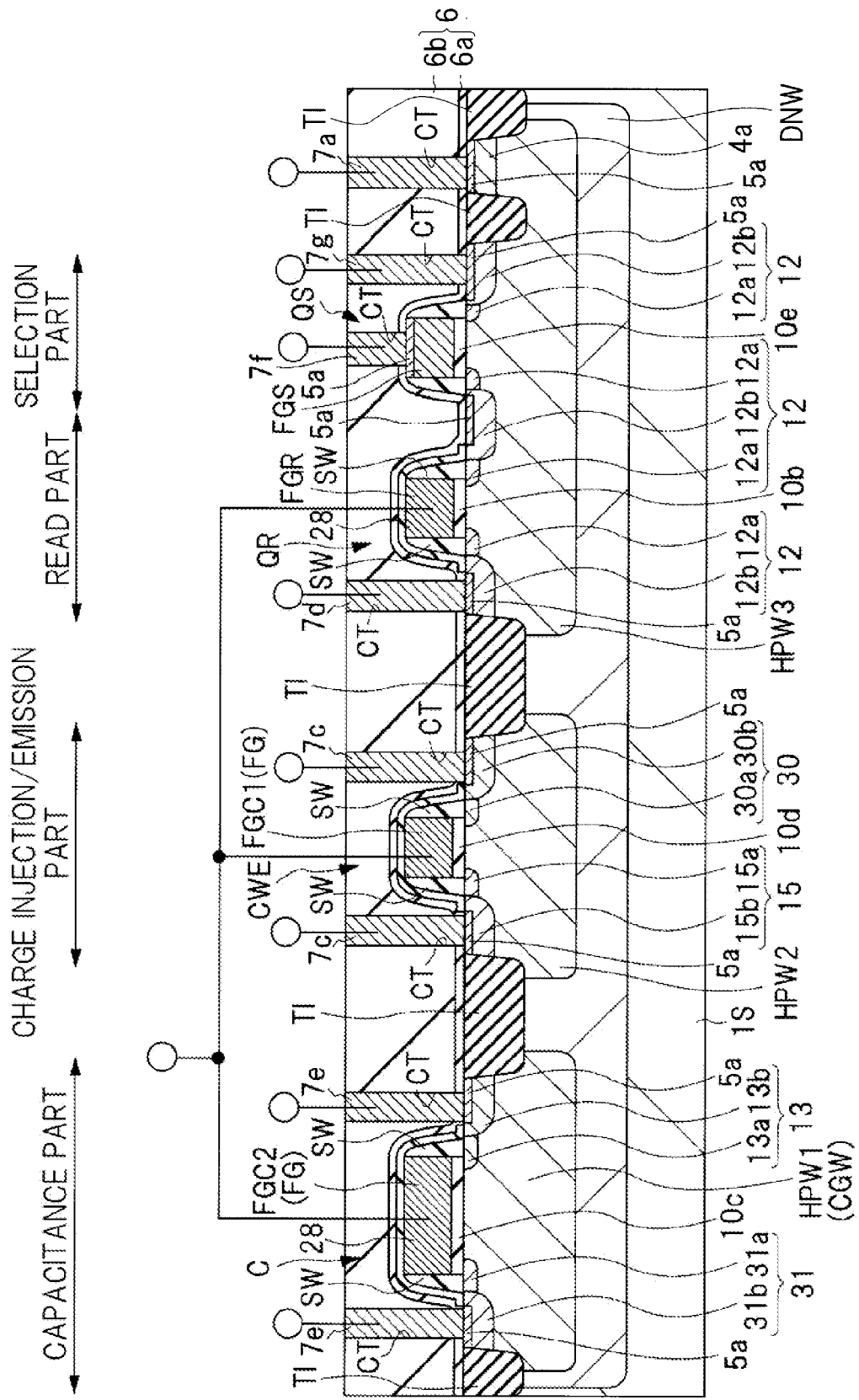
FIG. 9 is a principal part cross-sectional view subsequent to FIG. 8, during a manufacturing process of a semiconductor device.

Then, as shown in FIG. 9, after an insulating layer 6a made of, for example, silicon nitride has been deposited over the major surface of the substrate 1S (semiconductor wafer) by a CVD method or the like, an insulating layer 6b made of, for example, silicon oxide is deposited thereover having a thickness larger than that of the insulating layer 6a by a CVD method or the like. After that, the upper face of the insulating layer 6b is made flat by subjecting the insulating layer 6b to chemical mechanical polishing processing (CMP). Subsequently, the contact holes CT are formed in the insulating layer 6 by a lithography process and an etching process. Then, after a conductor film made of, for example, tungsten (W) has been deposited over the major surface of the substrate 1S (semiconductor substrate or semiconductor wafer) by a CVD method or the like, the conductor parts 7a, and 7c to 7g are formed within the contact holes CT by polishing the conductor film through the use of a CMP method or the like. After that, the semiconductor device is manufactured through a normal wiring formation process, inspection process, and assembly process.

FIG. 10 to FIG. 18 are principal part cross-sectional views of the read part and the charge injection/emission part of the memory cell MC1 during the manufacturing process, and are cross-sectional views along X2-X2 of FIG. 1, namely, principal part cross-sectional views when the charge injection/emission part and the read part of the memory cell MC1 are cut along the extension direction of the floating electrode FG.

Figure 10:
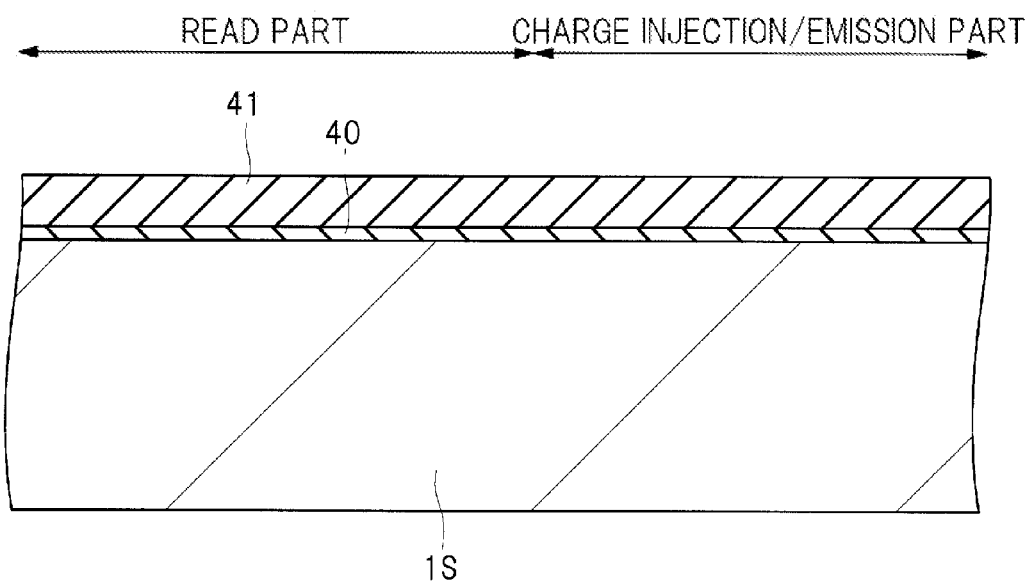
FIG. 10 is a principal part cross-sectional view showing a manufacturing method of a semiconductor device of the present embodiment.

First, as shown in FIG. 10, after a silicon oxide film 40 has been formed over the substrate 1S having a thickness of approximately 10 to 20 nm, a silicon nitride film 41 is formed having a thickness of approximately 170 to 200 nm.

Figure 11:
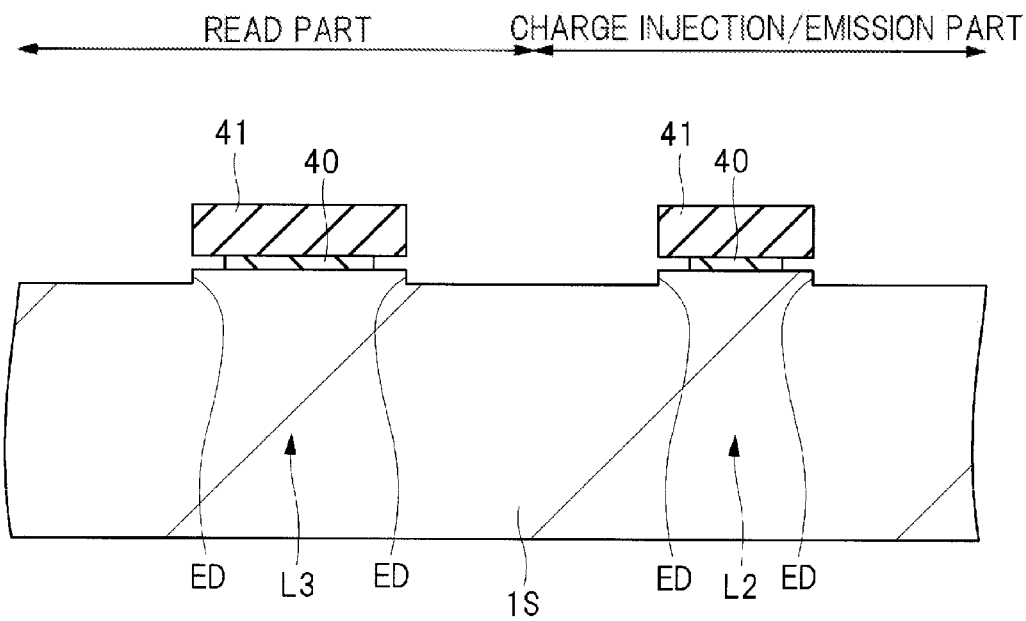
FIG. 11 is a principal part cross-sectional view subsequent to FIG. 10, during a manufacturing process of a semiconductor device.

Next, as shown in FIG. 11, the silicon nitride film 41 and the silicon oxide film 40 thereunder are patterned in a dry etching process through the use of an un-illustrated resist pattern as a mask. The silicon nitride film 41 and the silicon oxide film 40 are left in regions corresponding to the active regions L2 and L3 of FIG. 1, and removed in a region surrounding the active regions L2 and L3 (i.e., element separation region TI described above). In this dry etching process, the surface of the substrate 1S is subjected to over-etching and a recess is formed on the substrate 1S having a depth of approximately 10 to 30 nm, and thus corner parts ED are formed each having an angle of approximately 90 degrees in the peripheral parts of the active regions L2 and L3. Then, after the resist pattern has been removed, the silicon oxide film 40 is caused to recede from an end part of the patterned silicon nitride film 41 by approximately 10 nm by etching through the use of, for example, hydrofluoric acid or the like.

Subsequently, as shown in FIG. 12, a silicon oxide film 42 is formed in the element separation region TI by thermal oxidation of the substrate 1S. This silicon oxide film 42 has a thickness larger than that of the silicon oxide film 40 and has a thickness of, for example, approximately 20 to 65 nm. At this time, the silicon nitride film 41 functions as anti-oxidation film. In addition, the silicon oxide film 42 having a thickness larger than that of the silicon oxide film 40 is also formed in the portion where the silicon oxide film 40 recedes. This thermal oxidation process is performed for rounding the corner parts ED formed in the peripheral parts of the active regions L2 and L3. When the surface of the substrate 1S is focused on by the above-described over-etching process and thermal oxidation process, the concave part DP1 and the concave part DP2 are formed in the peripheral parts of the active region L2 and L3 with respect to the surfaces US2 and US3 of the substrate 1S in the center parts of the active regions L2 and L3. Next, the silicon oxide film 42 is removed from the element separation region TI by wet etching using, for example, hydrofluoric acid or the like.

Then, as shown in FIG. 13, a groove GV is formed in the substrate 1S in a dry etching process by using the patterned silicon nitride film 41 as a mask. The groove GV is formed in a region which is not covered by the patterned silicon nitride film 41, namely, in the element separation region TI. Chlorinated gas is used for the dry etching and the depth of the groove GV is 0.35 to 0.4 μm. While the side walls SS2 and SS3 of the active regions L2 and L3 constituting the groove GV extend approximately linearly in the depth direction from the surface of the substrate 1S, the side walls SS2 and SS3 have an inclination of $\alpha 0$ (approximately 110 degrees) with respect to the surface of the substrate 1S. The concave parts DP1 and DP2 remain in the shoulder parts S1 and S2 of the active regions L2 and L3, under the silicon nitride film 41.

Figure 14:
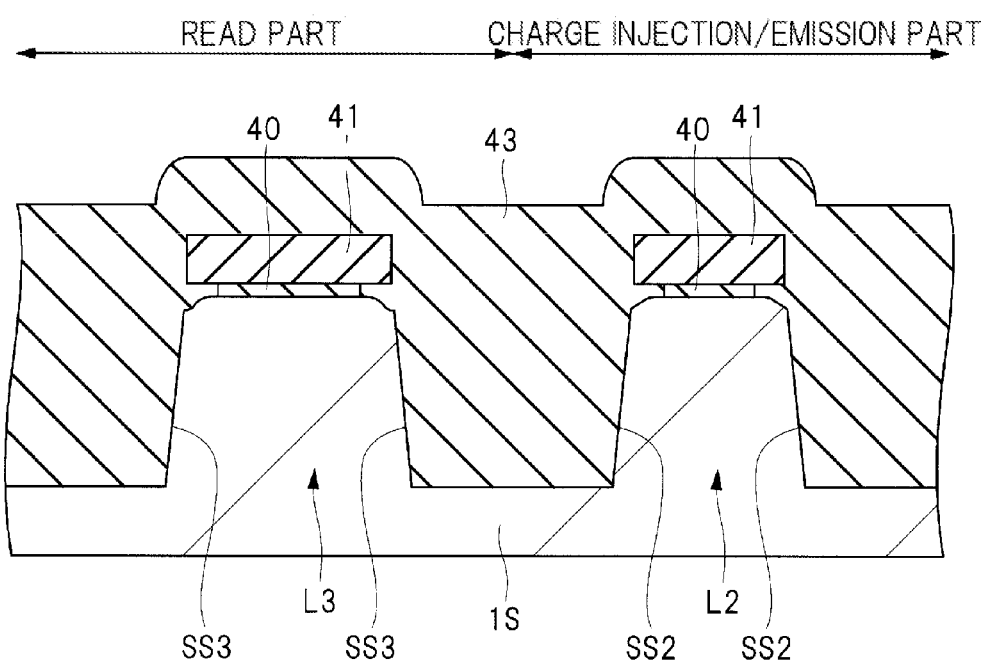
FIG. 14 is a principal part cross-sectional view subsequent to FIG. 13, during a manufacturing process of a semiconductor device.

After that, as shown in FIG. 14, a silicon oxide film 43 is formed over the substrate 1S including the inside of the groove GV by a CVD method. This silicon oxide film 43 is deposited having a large thickness so as to fill completely the inside of the groove GV. Then, the silicon oxide film 43 is subjected to thermal processing at approximately 1100° C., and thus it is possible to enhance the film quality of the silicon oxide film 43, and, for example, it is possible to enhance electrical insulation properties and etching-resistant properties.

Figure 15:
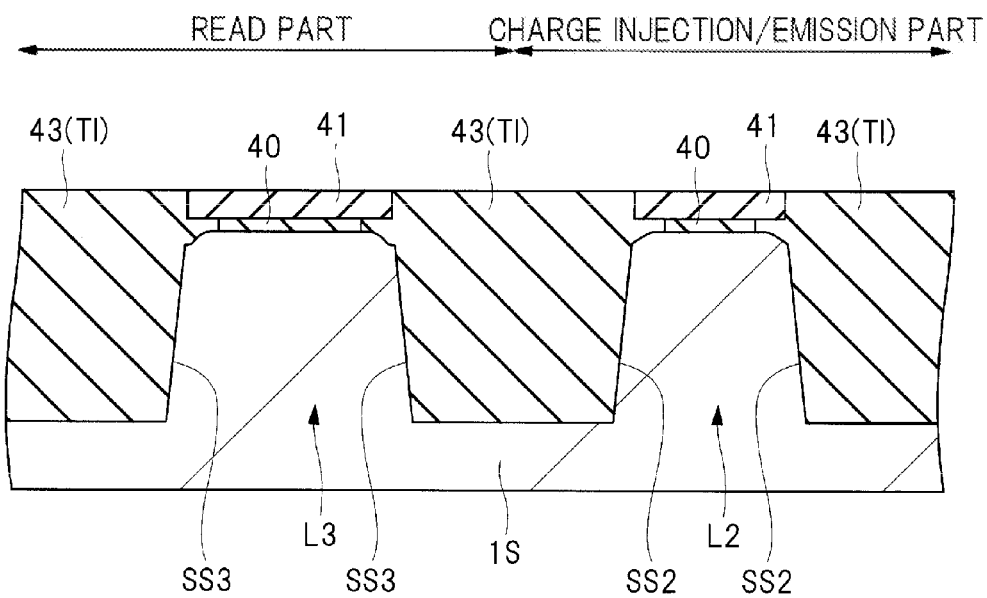
FIG. 15 is a principal part cross-sectional view subsequent to FIG. 14, during a manufacturing process of a semiconductor device.

Explaining through the use of FIG. 15, next, the silicon oxide film 43 is polished by chemical mechanical polishing (CMP). This polishing process is carried out under a condition in which the polishing rate of the silicon oxide film 43 is larger than that of the silicon nitride film 41, and thus the silicon nitride film 41 is caused to function as a stopper film. After the polishing of the silicon oxide film 43 over the active regions L2 and L3 and over the element separation region TI has been continued and the silicon nitride film 41 has been exposed, additional polishing is carried out for some time, and thereby it is possible to polish and remove completely the silicon oxide film 43 over the silicon nitride film 41. In the additional polishing, while the silicon nitride film 41 becomes thinner by polishing, as shown in FIG. 15, it is possible to form, in the element separation region TI, the silicon oxide film 43 having a polished surface which has approximately the same height as the surface of the silicon nitride film 41.

Figure 16:
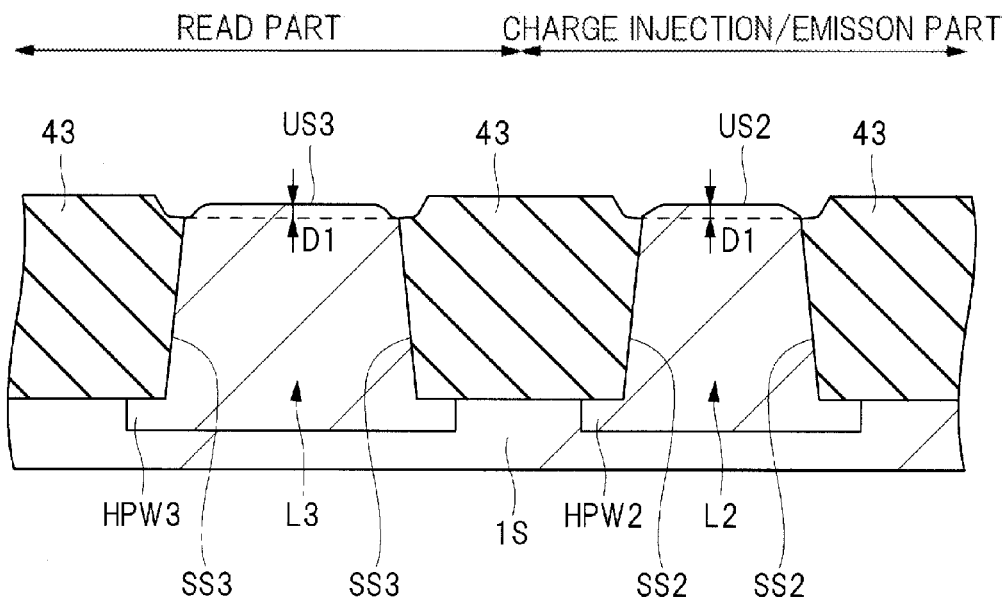
FIG. 16 is a principal part cross-sectional view subsequent to FIG. 15, during a manufacturing process of a semiconductor device.

Explaining through the use of FIG. 16, next, the silicon nitride film 41 remaining after the polishing process is removed by, for example, heated phosphoric acid or the like, and after that, the silicon oxide film 43 is subjected to etching processing using an etching solution such as hydrofluoric acid, and the surface of the silicon oxide film 43 at the center part of the element separation region TI is caused to have a height approximately equal to the heights of the surfaces US2 and US3 of the active regions L2 and L3. At this time, the silicon oxide film 40 on the surfaces US2 and US3 of the active regions L2 and L3 is also removed. Furthermore, since the etching solution penetrates from the side of the active regions L2 and L3, the surfaces of the silicon oxide film 43 becomes lower than the surface of the center part in the element separation region TI at the parts in contact with the active regions L2 and L3 and becomes lower than the surfaces US2 and US3 of the active regions L2 and L3, by D1. Here, each of the distances from the surfaces US2 and US3 of the active region L2 and L3 to the surfaces of the silicon oxide film 43 in contact with the active regions L2 and L3 are referred to as an "exposure depth". Subsequently, as explained through the use of FIGS. 4 and 5, the formation processes of the n-type embedded well DNW, and the p-type wells HPW2 and HPW3 are carried out. Here, only the p-type wells HPW2 and HPW3 are illustrated.

Figure 17:
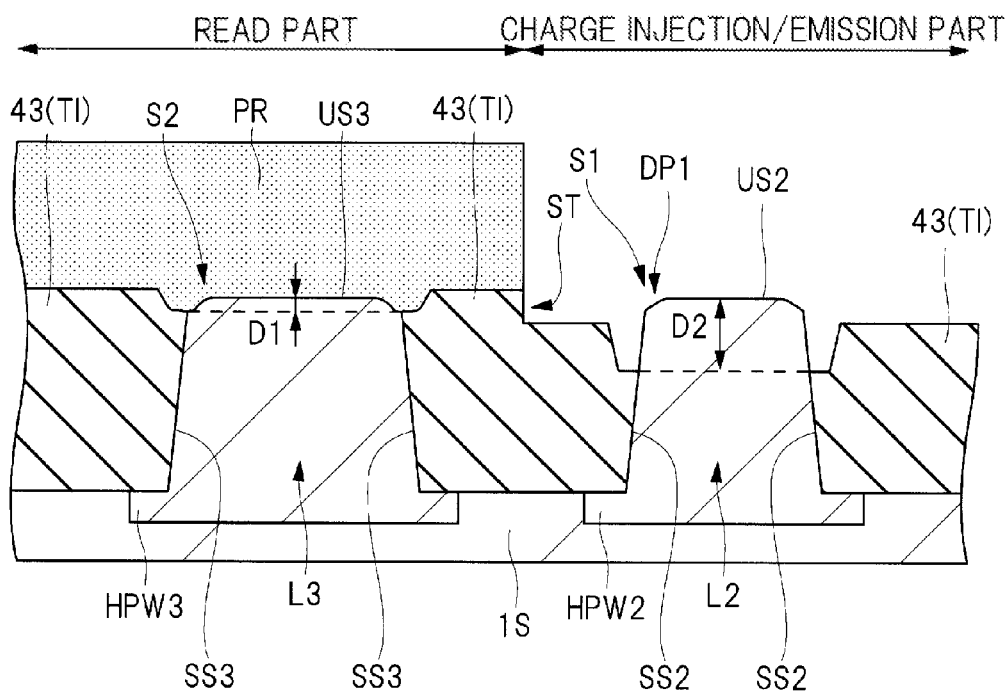
FIG. 17 is a principal part cross-sectional view subsequent to FIG. 16, during a manufacturing process of a semiconductor device.

Then, as shown in FIG. 17, in a state where the read part is covered by a mask PR and the charge injection/emission part is exposed selectively, the silicon oxide film 43 of the charge injection/emission part is subjected to etching and the side walls SS2 of the active region L2 are partially exposed. That is, in order to form the concave part DP2 at a position deeper than that of the concave part DP1, the surface of the silicon oxide film 43 in contact with the active region L2 needs to be deeper than the concave part DP1. In the charge injection/emission part, the surfaces of the silicon oxide 43 in contact with the side walls SS2 of the active region L2 are caused to become lower than the surface US2 of the active region L2 by D2. The exposure depth D2 in the active region L2 is caused to be larger than the exposure depth D1 in the active region L3 (D2>D1). In this manner, the separation part TI constituted of the silicon oxide film 43 is formed in the periphery of the active regions L2 and L3. As apparent from FIG. 17, a step ST is formed at a boundary portion between the read part and the charge injection/emission part, along with the above-described selective etching of the silicon oxide film 43. The mask PR is removed after the etching of the silicon oxide film 43 of the charge injection/emission part.

Figure 18:
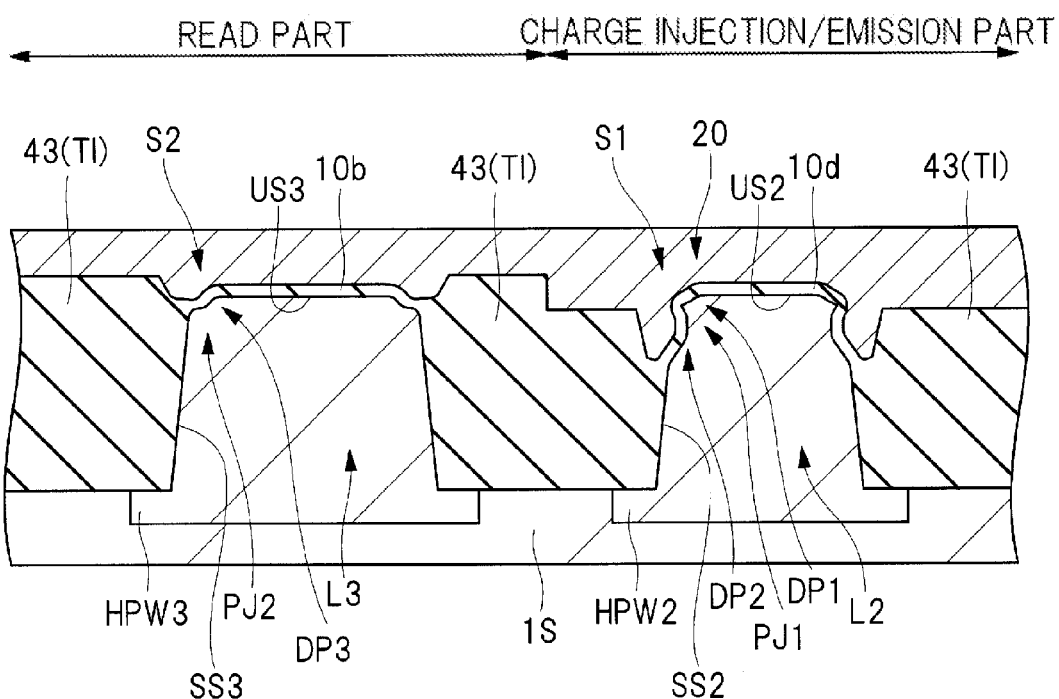
FIG. 18 is a principal part cross-sectional view subsequent to FIG. 17, during a manufacturing process of a semiconductor device.

Next, as shown in FIG. 18, the substrate 1S is subjected to thermal oxidation processing at approximately 850° C., and the capacitance insulating film 10$d$ and the gate insulating film 10$b$ constituted of silicon oxide films are formed on the surfaces of US2 and US3 of the active regions L2 and L3. As described above, the gate insulating film 10$b$ and the capacitance insulating film 10$d$ have an equal thickness. Since the charge injection/emission part is subjected to the thermal oxidation processing in a state where the surface US2 (upper face) and the side walls SS2 of the active region L2 made of silicon are exposed, silicon oxidation proceeds also from the exposed side walls SS2 in the shoulder part S1 of the active region L2 and the concave part DP2 is formed with respect to the imaginary straight line (b) along the side wall SS2, as shown in FIG. 3. Furthermore, the concave part DP1 is formed on the surface US2 of the active region L2, and the protrusion part PJ1 is constituted of the concave part DP1 and the concave part DP2 which is located under the concave part DP1. On the other side, since the read part is subjected to the thermal oxidation processing in a state where the side walls SS3 of the active region L3 are scarcely exposed, the concave part DP2 formed in the shoulder part S1 in the active region L2 is not formed in the shoulder part S2 in the active region L3.

Next, over the substrate 1S, the conductor film 20 made of low-resistance polycrystalline silicon is formed over the gate insulating film 10$b$ and the capacitance insulating film 10$d$ by, for example, a CVD method. The subsequent process is as explained through the use of FIGS. 6 to 9.

As shown in FIG. 17, it is possible to form the protrusion parts PJ1 and PJ2 having different shapes in the shoulder parts S1 and S2 of the active regions L2 and L3 by subjecting the charge injection/emission part and the read part to the thermal oxidation processing of forming the gate insulating film 10$b$ and the capacitance insulating film 10$d$ in a state where the heights of the silicon oxide film 43 in contact with the active regions L2 and L3 are different when the surfaces of the active regions L2 and L3 are used as references. That is, it is possible to make the protrusion part PJ1 into a shape more pointed than that of the protrusion part PJ2 by subjecting the charge injection/emission part to the thermal oxidation processing in a state where the height of the silicon oxide film 43 in contact with the active region L2 is made lower than that in the read part (D2>D1) and the side wall SS2 is exposed more widely than the side wall SS3.

In FIG. 16, the silicon oxide film 43 in contact with the active regions L2 and L3 may be lower than the heights of the side walls SS2 and SS3. That is, the exposure depth D1 may be larger than the depths of the first concave part DP1 and the third concave part DP3. In the process of thermal oxidation processing explained in FIG. 18, it is important that the exposure depth D2 of the active region L2 is larger than the exposure depth D1 of the active region L3, and it is possible to make the protrusion part PJ1 into a shape more pointed than that of the protrusion part PJ2 by carrying out the thermal oxidation processing in a state of keeping this relationship.

Note that, while the manufacturing method of the memory cells MC is explained through the use of the read part and the charge injection/emission part in FIG. 10 to FIG. 18, the capacitance element C and the selection element QS constituting the memory cells MC are also manufactured by the same manufacturing method as that of the read part.

While the invention achieved by the present inventors is explained specifically through the use of the embodiment thereof as above, it is needless to say that the present invention is not limited to the embodiment and can be variously modified within the range not departing from the gist of the invention.

What is claimed is:

1. A semiconductor device, comprising:
   a semiconductor substrate;
   an active region which is formed in a part of the substrate and includes an upper face, a side wall, a shoulder part connecting the upper face and the side wall;
   a separation part which is in contact with the side wall and surrounds the active region in a plan view;
   a conductor film covering the upper face and the shoulder part; and
   an insulating film provided between the conductor film and the active region,
   wherein the active region includes a protrusion part constituted of a first concave part with respect to the upper face and a second concave part with respect to the side wall, in the shoulder part.

2. The semiconductor device according to claim 1,
   wherein the first concave part is located closer to a side of the upper face than the second concave part.

3. The semiconductor device according to claim 1,
   wherein the conductor film covers the first concave part, the protrusion part, and the second concave part via the insulating film.

4. The semiconductor device according to claim 1, further comprising
   a semiconductor region within the active region,
   wherein the conductor film is set to a positive voltage with respect to the semiconductor region and FN tunnel current is caused to flow between the semiconductor region and the conductor film, and thereby the conductor film accumulates electrons.

5. The semiconductor device according to claim 4, still further comprising
   a memory cell constituted of a write/erase element, a read element, a selection element, and a capacitance element,
   wherein the write/erase element is formed in the active region.

6. A semiconductor device, comprising
   a semiconductor substrate;
   a first active region which is formed in a part of the semiconductor substrate and includes a first upper face, a first side wall, and a first shoulder part connecting the first upper face and the first side wall;
   a second active region which is formed in a part of the semiconductor substrate and includes a second upper face, a second side wall, and a second shoulder part connecting the second upper face and the second side wall;
   a separation part which is in contact with the first side wall and the second side wall and surrounds the first active region and the second active region in a plan view;
   a first conductor film covering the first upper face and the first shoulder part;
   a second conductor film covering the second upper face and the second shoulder part;
   a first insulating film provided between the first conductor film and the first active region; and
   a second insulating film provided between the second conductor film and the second active region,
   wherein the first active region includes a first protrusion part constituted of a first concave part with respect to the first upper face and a second concave part with respect to the first side wall, in the first shoulder part, and a second protrusion part constituted of a third concave part with respect to the second upper face and the second side wall, in the second shoulder part, wherein the first protrusion is more pointed than the second protrusion part.

7. The semiconductor device according to claim 6,
   wherein an angle of the first protrusion part is smaller than an angle of the second protrusion part.

8. The semiconductor device according to claim 6,
   wherein the first conductor film covers the first concave part, the first protrusion part, and the second concave part via the first insulating film.

9. The semiconductor device according to claim 6,
   wherein a thickness of the first insulating film on the first upper face is equal to a thickness of the second insulating film on the second upper face.

10. The semiconductor device according to claim 6, further comprising
    a memory cell constituted of a write/erase element, a read element, a selection element, and a capacitance element,
    wherein the write/erase element is formed in the first active region and the read element is formed in the second active region.

11. The semiconductor device according to claim 10,
    wherein the first conductor film and the second conductor film are integrally formed.

12. The semiconductor device according to claim 11, further comprising
    a semiconductor region within the first active region,
    wherein the first conductor film accumulates electrons when a voltage of the first conductor film is made positive with respect to the semiconductor region and FN tunnel current is caused to flow between the semiconductor region and the first conductor film.

* * * * *